US012677503B2

(12) United States Patent
Tan et al.

(10) Patent No.: US 12,677,503 B2
(45) Date of Patent: Jul. 7, 2026

(54) LIGHT EMITTING DIODE PRECURSOR AND ITS FABRICATION METHOD

(71) Applicant: PLESSEY SEMICONDUCTORS LIMITED, Plymouth (GB)

(72) Inventors: Wei Sin Tan, Plymouth (GB); Andrea Pinos, Plymouth (GB); Samir Mezouari, Plymouth (GB); Kevin Stribley, Plymouth (GB); Gary Day, Plymouth (GB)

(73) Assignee: PLESSEY SEMICONDUCTORS LIMITED, Plymouth (GB)

( * ) Notice: Subject to any disclaimer, the term of this patent is extended or adjusted under 35 U.S.C. 154(b) by 1013 days.

(21) Appl. No.: 17/786,688

(22) PCT Filed: Dec. 9, 2020

(86) PCT No.: PCT/EP2020/085344
§ 371 (c)(1),
(2) Date: Jun. 17, 2022

(87) PCT Pub. No.: WO2021/122240
PCT Pub. Date: Jun. 24, 2021

(65) Prior Publication Data
US 2023/0019308 A1 Jan. 19, 2023

(30) Foreign Application Priority Data

Dec. 18, 2019 (GB) ...................................... 1918746

(51) Int. Cl.
H10H 20/01 (2025.01)
H10H 20/812 (2025.01)
(Continued)

(52) U.S. Cl.
CPC .... H10H 20/01335 (2025.01); H10H 20/812 (2025.01); H10H 20/821 (2025.01);
(Continued)

(58) Field of Classification Search
None
See application file for complete search history.

(56) References Cited

U.S. PATENT DOCUMENTS

| 7,205,168 B2 | 4/2007 | Oohata et al. |
| 9,012,930 B2 | 4/2015 | Akagi |
| | (Continued) | |

FOREIGN PATENT DOCUMENTS

| JP | H10107320 A | 4/1998 |
| JP | H11177135 A | 7/1999 |
| | (Continued) | |

OTHER PUBLICATIONS

International Search Report, PCT/EP2020/085344, dated May 28, 2021, 7 pages.
(Continued)

*Primary Examiner* — Alexander G Ghyka
(74) *Attorney, Agent, or Firm* — STINSON LLP

(57) ABSTRACT

A method of forming a Light Emitting Diode (LED) precursor is provided. The method comprises forming a LED stack comprising a plurality of Group III-nitride layers on a substrate, the LED stack comprising a LED stack surface formed on an opposite side of the LED stack to the substrate, and masking a first portion of the LED stack surface, leaving a second portion of the LED stack surface exposed. The second portion of the LED stack surface is subjected to a resistivity changing process such that a second region of the LED stack below the second portion of the LED stack surface comprising at least one of the Group III-nitride layers of the LED stack has a relatively higher resistivity than a resistivity of the respective Group-III nitride layer in a first region of the LED stack below the first portion of the LED stack surface.

15 Claims, 11 Drawing Sheets

(51) Int. Cl.

| | |
|---|---|
| *H10H 20/821* | (2025.01) |
| *H10H 20/825* | (2025.01) |
| *H10H 20/83* | (2025.01) |
| *H10H 20/84* | (2025.01) |

(52) U.S. Cl.
CPC .......... *H10H 20/825* (2025.01); *H10H 20/83* (2025.01); *H10H 20/84* (2025.01); *H10H 20/032* (2025.01); *H10H 20/034* (2025.01)

(56) References Cited

U.S. PATENT DOCUMENTS

| | | | |
|---|---|---|---|
| 2005/0029533 A1 | 2/2005 | Wu et al. |
| 2005/0285126 A1 | 12/2005 | Wu et al. |
| 2011/0095335 A1 | 4/2011 | Ishida et al. |
| 2011/0263054 A1 | 10/2011 | Yu et al. |
| 2012/0223351 A1 | 9/2012 | Margalit |
| 2014/0077220 A1 | 3/2014 | Kryliouk et al. |
| 2015/0270451 A1 | 9/2015 | Chowdhury et al. |
| 2016/0197232 A1 | 7/2016 | Bour et al. |
| 2019/0267357 A1 | 8/2019 | Iguchi et al. |

FOREIGN PATENT DOCUMENTS

| | | |
|---|---|---|
| JP | 2011205099 A | 10/2011 |
| JP | 2014056984 A | 3/2014 |
| JP | 2019152851 A | 9/2019 |
| KR | 20070047047 A | 5/2007 |
| WO | 2004102686 A1 | 11/2004 |
| WO | 2019186798 A1 | 10/2019 |

OTHER PUBLICATIONS

Written Opinion, PCT/EP2020/085344, dated May 28, 2021, 10 pages.

Search Report for Taiwanese Application No. 109144441, dated Sep. 28, 2021, 14 pages.

Great Britain Search Report, Application No. GB1918746.7, dated May 28, 2020, 8 pages.

LIGHT EMITTING DIODE PRECURSOR AND ITS FABRICATION METHOD

REFERENCE TO RELATED APPLICATIONS

This application is the 371 U.S. national stage application of International Patent Application No. PCT/EP2020/085344, filed Dec. 9, 2020, which claims the benefit of Great Britain Patent Application No. 1918746.7, filed Dec. 18, 2019, the entire disclosures of which are incorporated herein by reference.

FIELD OF THE DISCLOSURE

The present disclosure relates to a light emitting diode (LED) precursor, and a light emitting diode array precursor. In particular, the present disclosure relates to LED precursors and LED array precursors comprising Group III-nitrides.

BACKGROUND

Micro LED arrays are commonly defined as arrays of LEDs with a size of $100 \times 100$ μm² or less. Micro LED arrays are a self-emitting component in a micro-display/projector which are suitable for use in a variety of devices such as smartwatches, head-wearing displays, head-up displays, camcorders, viewfinders, multisite excitation sources, and pico-projectors.

One type of micro LED array comprises a plurality of LEDs formed from Group III-nitrides. Group III-nitride LEDs are inorganic semiconductor LEDs comprising, for example, GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from, high brightness. For example, applications which benefit from high brightness may include displays in high brightness environments or projectors. Additionally, Group III-nitride micro LED arrays are known to have relatively high luminous efficacy, expressed in lumens per watt (lm/W) compared to other conventional large area LEDs. The relatively high luminous efficacy of Group III-nitride micro LED arrays reduces power usage compared with other light sources and makes micro LEDs particularly suitable for portable devices.

Various methodologies for forming micro LEDs from Group III-nitride LEDs are known to the skilled person.

For example, a selective area growth (SAG) methodology is described in U.S. Pat. No. 7,087,932. In the selective area growth technique, a mask is patterned on a buffer layer. The material in the mask is such that the at the growth conditions, no additional material is grown directly on the mask but only inside apertures exposing portions of the surface of the underlying buffer layer. Another noteworthy feature of selective area growth of Group III-nitrides grown along the [0001] direction is that depending on the growth parameters such as growth temperature, pressure, and V/III ratio, inclined facets with respect to the (0001) plane also known as c-plane are obtained around the perimeter of the growing portions of c-plane semiconductor as defined by the open areas of the patterned mask. The inclined facets are generally oriented along the $\{1\ \bar{1}\ 0\ 1\}$ or $\{1\ \bar{1}\ 0\ 2\}$ planes of the wurtzite crystal and present reduced polarisation fields compared with c-plane surfaces (semi-polar surfaces).

In many applications it is desirable to provide a micro-LED array capable of outputting light having a range of wavelengths (i.e. a colour display/projector). For example, in many colour displays it is desirable to provide a micro-LED array with having plurality of pixels on a common substrate, wherein each pixel may output a combination of, for example, red, green, and blue light.

One approach known in the art is to form each pixel of an LED array from a plurality of sub-pixels. Each pixel may be provided with one or more colour converting materials, such as phosphors or quantum dots. Such colour converting materials can convert light of a higher energy (pump light) into light of a lower energy (converted light) in order to provide the desired colours of the sub-pixels.

It is an object of the present invention to provide an improved method of forming a LED which tackles at least one of the problems associated with prior art methods or, at least, provide a commercially useful alternative thereto.

SUMMARY OF THE DISCLOSURE

The present inventors have realised that it is desirable to provide an LED in which, during operation, current is confined towards a central region of the LED and away from sidewall regions of the LED.

Thus, according to a first aspect of the disclosure, a method of forming a LED precursor is provided. The method comprises:

forming a LED stack comprising a plurality of Group III-nitride layers on a substrate, the LED stack comprising a LED stack surface formed on an opposite side of the LED stack to the substrate;

masking a first portion of the LED stack surface, leaving a second portion of the LED stack surface exposed; and subjecting the second portion of the LED stack surface to a poisoning process such that a second region of the LED stack below the second portion of the LED stack surface comprising at least one of the Group III-nitride layers of the LED stack has a relatively higher resistivity than a resistivity of the respective Group-III nitride layer in a first region of the LED stack below the first portion of the LED stack surface.

The present inventors have realised that a poisoning process can be used to modify the resistivity of a region of the as-deposited LED stack. By masking a portion of the LED stack surface, a region of the LED stack below the masked first portion of the LED stack surface is substantially unaffected by the poisoning process. Accordingly, following the poisoning process the local resistivity of a first region of the LED stack below the first portion of the LED stack surface is lower than the local resistivity of the LED stack in a second region below the second portion of the LED stack surface. That is to say, the poisoning process modifies the resistivity of at least one of the plurality of layers of the LED stack such that a second region of at least one layer is greater than a first region of said layer. By modifying the resistivity of the second region of the LED stack, current confinement in the LED may be improved during use.

For example, in some embodiments current confinement may be increased towards a central region of a LED, and away from sidewall regions of a LED. Sidewall regions of an LED may be prone to leakage currents. By confining current away from sidewall regions, the effects of leakage current in sidewall regions of an LED may be reduced or eliminated. As such, in some LEDs increasing current confinement may improve light extraction efficiency of the LED.

In some LEDs, a colour converting layer may also be provided. Typically, light from the LED is directed into the colour converting layer. The presence of sidewall leakage currents in a LED may result in the intensity of light output by the LED not being generally uniform across the light emitting surface of the LED. As such, the light output by the LED may provide "hotspots". Hotspots are regions of the light emitting surface in which light is output with a high intensity relative to the average intensity of light output by the LED across the light emitting surface. Hotspots may degrade the functionality of colour converting materials over time, due to the high intensity of light. Thus, it is an object of the disclosure to reduce the presence of hotspots in LEDs formed from the LED precursors of this disclosure.

It will be appreciated that the poisoning process reduces sidewall leakage currents through the formation of regions in the LED of a higher resistivity. Furthermore, the poisoning process can be used to form one or more regions of higher resistivity in the LED stack for the purpose of improving the distribution of current through the LED stack. This in turn improves the distribution of light flux across the light emitting surface of the LED when in use, thereby reducing or eliminating the formation of hotspots. Accordingly, LED precursors according to this disclosure may be used to improve the lifetime of colour converting materials in LEDs.

In some embodiments, masking the first portion of the LED stack surface comprises selectively forming a contact layer on the first portion of the LED stack surface. As such, the method according to the first aspect use a contact layer as a self-aligning mask for the poisoning process.

In some embodiments, forming the LED stack comprises: forming a first semiconducting layer comprising a Group III-nitride on the substrate, forming an active layer comprising a Group III-nitride on the first semiconducting layer, and forming a p-type semiconducting layer comprising a Group III-nitride on the active layer. A major surface of the p-type semiconducting layer on an opposite side of the p-type semiconducting layer to the active layer provides an LED stack surface of the LED stack.

In some embodiments, the poisoning process selectively increases a resistivity of a second portion of the p-type semiconducting layer. As such poisoning process may be a surface treatment process which increases the resistivity of the second portion of the p-type semiconducting layer forming the second portion of the LED stack surface.

In some embodiments, the second region of the LED stack includes a second region of the active layer; and the first region of the LED stack includes a first region of the active layer. For example, in some embodiments, the poisoned second region of the LED stack may extend from the LED stack surface through the second region of the p-type semiconducting layer to the second region of the active layer. As such, the (poisoned) second region of the LED stack may be a continuous region comprising the second regions of the p-type semiconducting layer and the active layer. In embodiments where the poisoning process affects the active layer, sidewall leakage currents into the active layer may be reduced, thereby improving current confinement within the LED.

In some embodiments, the second region of the LED stack includes a second region of the first semiconducting layer, and the first region of the LED stack includes a first region of the first semiconducting layer. For example, in some embodiments the (poisoned) second region of the LED stack may extend from the LED stack surface through the second region of the p-type semiconducting layer and the active layer to the second region of the first semiconductor layer. As such, the (poisoned) second region of the LED stack may be a continuous region comprising the second regions of the p-type semiconducting layer, active layer, and first semiconducting layer.

It will be appreciated that the second region of the LED stack extends in a direction generally aligned with the direction normal to the light emitting surface of the LED stack/substrate surface. As such, the layers of the LED stack within the second region form a column with a cross sectional area defined by the second portion of the LED stack surface.

In some embodiments, the second portion of the LED stack surface encircles the first portion of the LED stack surface. Accordingly, the second portion of the LED stack surface may be arranged relative to the first portion of the LED stack surface to further reduce leakage current from sidewall regions of the LED stack.

In some embodiments, masking the first portion of the LED stack surface comprises masking a plurality of first portions in order to define a plurality of second portions of the LED stack surface, wherein optionally the plurality of second portions of the LED stack surface are arranged in an annular or chequerboard pattern. As such, the LED stack surface may be patterned prior to the poisoning process with a pattern configured to further reduce the occurrence of hotspots on a light emitting surface of the LED.

In some embodiments, a first portion of the LED stack surface is masked with a contact layer and a third portion of the LED stack surface is masked with a masking layer such that the first and third portions of the LED stack surface are covered and the second portion of the LED stack surface is exposed. Thus, in some embodiments, a contact layer may be used in combination with a masking layer to define the second portions of the LED stack surface to be subjected to the poisoning process. For example, in some embodiments the masking layer and the contact layer are formed on the LED stack surface in order to define one or more second portions of the LED stack surface having an annular or chequerboard pattern.

In some embodiments, the poisoning process comprises exposing the second portion of the LED stack surface to a plasma comprising hydrogen ions. In other embodiments, other types of plasma may be used. In another embodiment, an ion implantation process may be used to poison the LED stack in the desired regions.

In some embodiments, the LED stack comprises a column having a regular trapezoidal cross-section in a plane normal to the substrate surface. By forming a LED stack with a regular trapezoidal cross-section, the LED stack may comprise sidewalls which are inclined (inclined sidewalls) relative to the substrate/light emitting surface of the LED. In some embodiments, the inclined sidewall regions of the LED stack may have an increased resistivity relative to the mesa portion of the LED stack. As such, current through the LED stack may generally be confined to the mesa portion of the LED stack. The inclined sidewalls may also improve the light extraction efficiency of light generated in the active layer of the LED stack by internally reflecting light towards the light emitting surface of the LED stack.

In some embodiments, forming the LED stack comprises: forming the first semiconducting layer on a substrate surface of the substrate, the first semiconducting layer having a growth surface on an opposite side of the first semiconducting layer to the substrate; selectively removing a portion of the first semiconducting layer to form a mesa structure such that the growth surface of the first semiconducting layer comprises a mesa surface and a bulk semiconducting surface; monolithically forming a second semiconducting layer comprising a Group III-nitride on the growth surface of the first semiconducting layer such that the second semiconducting layer covers the mesa surface and the bulk semiconducting surface. The active layer and the p-type semiconducting layer are formed on the second semiconducting layer. Accordingly, the LED stack may incorporate a mesa structure over which the other layers of the LED stack are overgrown. By overgrowing the active layer over the mesa structure, charge carriers may be further confined in the region of the active layer aligned with the mesa structure, and away from sidewall regions of the LED structure.

In some embodiments, the second semiconducting layer is formed on the growth surface of the first semiconducting layer to provide an inclined sidewall portion extending between a first portion of the second semiconducting layer on the mesa surface of the first semiconducting layer and a second portion of the second semiconducting layer on the bulk semiconducting surface of the first semiconducting layer. In some embodiments, the first semiconducting layer may be an n-type doped semiconductor (i.e. an n-type doped Group-III-nitride semiconductor). In some embodiments, the second semiconducting layer may be an n-type doped semiconductor (i.e. an n-type doped Group III-nitride semiconductor). For example, the first and second semiconducting layer may be formed from substantially the same Group III nitride. In some embodiments, the second semiconducting layer may be a substantially undoped semiconductor (i.e. a Group-III-nitride semiconductor not including any intentional dopant).

In some embodiments, the second region of the LED stack includes a second region of the second semiconducting layer, and the first region of the LED stack includes a first region of the second semiconducting layer. For example, in some embodiments the (poisoned) second region of the LED stack may extend from the LED stack surface through the second region of the p-type semiconducting layer and the active layer to the second region of the second semiconductor layer. As such, the (poisoned) second region of the LED stack may be a continuous region comprising the second regions of the p-type semiconducting layer, active layer, and second semiconducting layer.

In some embodiments, forming the first semiconducting layer on the substrate comprises: forming a first semiconducting sublayer comprising a Group III-nitride on the substrate surface; forming a dielectric sublayer on the first semiconducting sublayer, the dielectric sublayer defining an aperture through a thickness of the dielectric sublayer; and forming a second semiconducting sublayer comprising a Group III-nitride on the dielectric sublayer.

Selectively removing a portion of the first semiconducting layer to form a mesa structure comprises selectively removing a portion of the second semiconducting sublayer to form a mesa structure which is aligned with the aperture of the dielectric sublayer. Accordingly, a further insulating sublayer may be included on the n-type side of the LED stack which includes an aperture through which current may flow. The aperture may be provided to further improve the current confinement of the LED stack towards the mesa and away from the sidewall regions.

In some embodiments, the active layer of the LED stack comprises a plurality of quantum well layers configured to output visible light. For example, the active layer of the LED stack may be arranged to output light having a peak wavelength of at least 420 nm. The active layer of the LED stack be arranged to output light having a peak wavelength of no greater than 650 nm. As such, the LED stack may be arranged to output visible light which is generally blue, green or red. In particular, the active layer may be arranged to output visible light having a wavelength of at least 425 nm and no greater than 490 nm.

In some embodiments, the LED precursor is a micro LED precursor wherein the LED stack has a surface area on the substrate of no greater than 100 μm×100 μm, or no greater than 10 μm×10 μm. As such, a micro LED precursor may be formed according to the method of the first aspect. It will be appreciated that a plurality of LED precursors, or micro LED precursors may be formed as an array on a substrate. Such precursors may be further processed to form a display comprising a plurality of LEDs/micro LEDs.

According to a second aspect of the disclosure, a LED precursor is provided. The LED precursor comprises a LED stack. The LED stack comprises a plurality of Group III-nitride layers. The LED stack comprises a LED stack surface formed on an opposite side of the LED stack to a light emitting surface of the LED stack. A first portion of the LED stack surface defines a first region of at least one of the plurality of layers of the LED stack below the LED stack surface having a first resistivity. A second portion of the LED stack surface defines a second region of the LED stack below the LED stack surface in which a resistivity of the respective layer of the LED stack is increased relative to the first region of the LED stack.

The LED precursor according to the second aspect may be formed by the method according to the first aspect of the disclosure. As such, the second region of the LED stack may be formed following a poisoning process in which the resistivity of the second region is increased. Accordingly, the LED precursor of the second aspect may incorporate all the above described features of the first aspect of the disclosure.

In some embodiments, the LED precursor further comprises a contact layer formed on the first portion of the LED stack surface. As such, the contact layer may act as a self-aligned mask for defining the first and second portions of the LED stack surface. In some embodiments, the contact layer may be formed to cover the first portion of the LED stack surface and at least some of the second portion of the LED stack surface.

In some embodiments, the LED stack comprises: a first semiconducting layer comprising a Group III-nitride providing the light emitting surface of the LED stack, an active layer comprising a Group III-nitride and provided on the first semiconducting layer; and a p-type semiconducting layer comprising a Group III-nitride and provided on the active layer. A major surface of the p-type semiconducting layer on an opposite side of the p-type semiconducting layer to the active layer provides an LED stack surface of the LED stack.

In some embodiments, the LED precursor is a micro LED wherein the LED stack has a surface area on the substrate of no greater than 100 μm×100 μm. In some embodiments, a plurality of LED precursors, or micro LED precursors may be formed as an array on a substrate. Such precursors may be further processed to form a display comprising a plurality of LEDs/micro LEDs.

According to a third aspect of the disclosure, a LED may be provided. The LED comprises a LED layer configured to emit pump light having a pump light wavelength from a light emitting surface. The LED layer comprises a LED precursor according to the second aspect of the disclosure. The LED also comprises a container layer provided on the light emitting surface of the LED layer. The container layer has a container surface on an opposite side of the container layer to the light emitting surface. The container surface includes an opening defining a container volume through the container layer to the light emitting surface of the LED layer. The LED also comprises a colour converting layer provided in the container volume. The colour converting layer is configured to absorb pump light and emit converted light of a converted light wavelength longer than the pump light wavelength. The LED also comprises a lens provided on the container surface over the opening, the lens having a convex surface on an opposite side of the lens to the colour converting layer.

Accordingly, a LED including a colour converting layer is provided which has reduced hotspots resulting from improved distribution of light flux. Thus, the colour converting layers of the third aspect of the disclosure may have improved lifetime.

In some embodiments, the LED of the third aspect may be provided as an LED array (i.e. a plurality of LEDs). Thus, a plurality of LED precursors may be provided in the LED layer, and a plurality of container volumes may be provided. A further colour converting layer may be provided in a further container volume of the plurality of container volumes, the further colour converting layer configured to absorb pump light and emit second converted light of a second converted light wavelength longer than the first converted light wavelength. A lens may be provided over the further container volume. Thus, an array of LEDs having different colours (e.g. red, green, blue) may be provided.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

Figure 1:
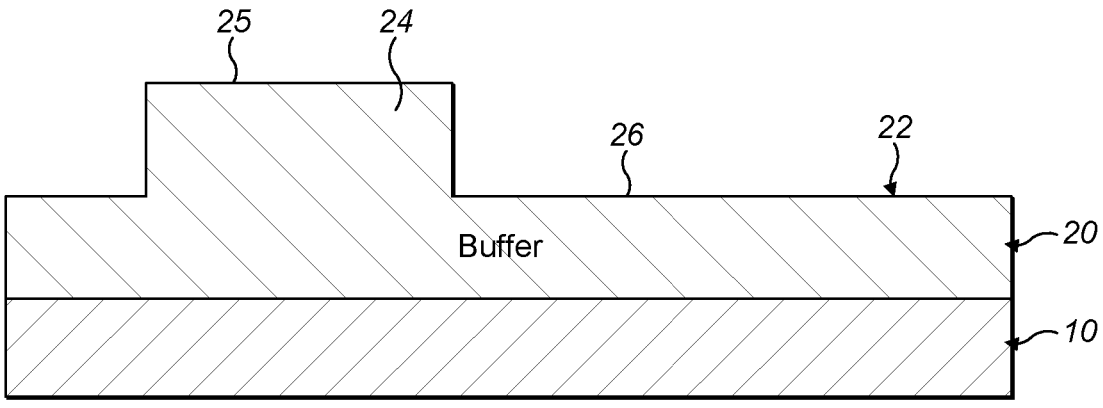
FIG. 1 shows a diagram of an intermediate step of a method according to an embodiment of the disclosure in which a first semiconducting layer including a mesa structure is provided.

According to this disclosure, a light emitting diode (LED) precursor 1, and a method of forming a light emitting diode precursor 1 is provided.

A LED precursor 1 according to an embodiment of this disclosure comprises: a substrate 10, a LED stack 12, and a contact layer 14. The contact layer 14 is provided on a first portion of the LED stack surface 15a which covers a first portion of the LED stack 12 such that the contact layer 14 defines a first region of the LED stack 12 below the contact layer. A second portion of the LED stack surface 15b defines a second region of the LED stack 12 below the second portion of the LED stack surface 15. In the second region of the LED stack 12 a resistivity of at least one of the plurality of layers of the LED stack is increased relative to a resistivity of the respective layer of the LED stack 12 in the first region of the LED stack.

In some embodiments, the LED precursor may be a micro LED precursor, wherein the LED stack has a surface area on the substrate 10 of no greater than 100 μm×100 μm, or no greater than 10 μm×10 μm.

The substrate 10 may be any substrate 10 suitable for the formation of Group III-nitride electronic devices. For example, the substrate 10 may be a sapphire substrate, or a silicon substrate. The substrate 10 may comprise one or more buffer layers configured to provide a substrate surface suitable for the formation of Group III-nitride layers.

The LED stack 12 comprises a plurality of layers. Each of the layers of the LED stack 12 comprises a Group III-nitride. In some embodiments, the LED stack comprises a first semiconducting layer, an active layer, and a p-type semiconducting layer. The LED stack 12 is configured to provide a Group III-nitride semiconductor junction capable of generating visible light. The Group III-nitride layers of the LED stack may be provided in a variety of arrangements. One possible example of a method for forming a LED stack 12 will now be described with reference to FIGS. 1 to 4. Further details of the method of forming the LED stack 12 may also be found in GB 1912853.7.

As shown in FIG. 1, a substrate 10 may be provided for forming the LED thereon. The substrate may be any substrate 10 suitable for the formation of Group III-nitride optoelectronic devices.

A first semiconducting layer 20 may be formed on the substrate surface. The first semiconducting layer 20 comprises a Group III-nitride. In some embodiments, the first semiconducting layer 20 may be n-type doped. In other embodiments, the first semiconducting layer 20 may not be intentionally doped.

For example, in the embodiment of FIG. 1, the first semiconducting layer 20 comprises GaN. The GaN may be n-typed doped using a suitable dopant, for example Si, or Ge. The first semiconducting layer 20 may be deposited using any suitable process for the fabrication of Group III-nitride thin films, for example, Metal Organic Chemical Vapour Deposition (MOCVD), or Molecular Beam Epitaxy (MBE). The first semiconducting layer 20 has a first surface which is a surface of the first semiconducting layer 20 on an opposite side of the first semiconducting layer 20 to the substrate 10. The first surface is used to form at least a portion of a growth surface 22 on which the layers of the LED structure are deposited.

In some embodiments, the first semiconductor layer 20 may be formed on the substrate 10 with a (0001) crystal plane provided parallel to a surface of the substrate.

The growth surface 22 of the first semiconducting layer 20 may be subsequently shaped using a selective removal process. As such, portions of the first semiconducting layer 20 are selectively removed to form a mesa structure 24 such that the growth surface 22 of the first semiconducting layer 20 comprises a mesa surface 25 and a bulk semiconducting layer surface 26.

For example, in FIG. 1 the growth surface 22 may be shaped using an etching process. In the etching process, a mesa-defining mask layer (not shown) may be deposited on the first surface of the first semiconducting layer 20. The mesa-defining mask layer is configured to mask portions of the first semiconductor layer 20 which are intended to form mesa surfaces 25 of the growth surface. Un-masked portions of the first semiconducting layer 20 may then be selectively removed using a dry etching process, typically in an inductively coupled plasma system using $Cl_2$-based gases. The etchant may etch away portion of the first semiconducting layer 20 to expose a bulk semiconducting layer surface 26 of the first semiconducting layer 20. That is to say, the etchant may not etch completely through the thickness of the first semiconducting layer 20 to expose the substrate 10 below. The mesa-defining mask layer may then be removed from the first semiconductor layer. By following the above process, the first semiconducting layer 20 may be shaped to provide a mesa structure 24 which is monolithically provided on a bulk semiconductor layer surface 26, for example as shown in FIG. 1.

In some embodiments, the mesa surface 25 portion of the first semiconducting layer 20 may not be selectively removed. Accordingly, the alignment of the mesa surface 25 with respect to the substrate 10 may be unchanged following the selective removal step. As such, the mesa surface 25 may be parallel to a surface of the substrate. In some embodiments, the first semiconductor layer is etched such that the bulk semiconductor surface 26 is also substantially parallel to the substrate 10. Accordingly, the mesa surface 25 and the bulk semiconductor surface 26 of the first semiconductor layer 20 may both be surfaces which are substantially parallel to each other. In some embodiments, the mesa surface 25 and the bulk semiconductor surface 26 may be aligned with (0001) planes of the Group III-nitride forming the first semiconducting layer 20.

In FIG. 1, the mesa structure 24 comprises sidewalls which are substantially perpendicular to the bulk semiconducting surface 26 and the mesa surface 25. In other embodiments, the mesa structures 24 may be formed with inclined sidewalls. For example, different etchants may be used to control the shape of the sidewalls formed during the selective removal process.

Next, additional layers of the LED stack 12 may be formed monolithically on the growth surface 22 of the first semiconductor layer 20. The additional layers of the LED stack 12 cover the mesa surface 25 and the bulk semiconducting layer surface 26. Accordingly, the LED stack 12 comprises a plurality of layers, wherein each layer comprises a Group III-nitride. In some embodiments, the Group III-nitrides comprise one of more of AlInGaN, AlGaN, InGaN and GaN.

Monolithically forming a LED stack 12 refers to the formation of an LED structure as a single piece. That is to say, the additional layers of the LED stack 12 are formed as a single piece on the growth surface of the first semiconductor layer 20.

Figure 2:
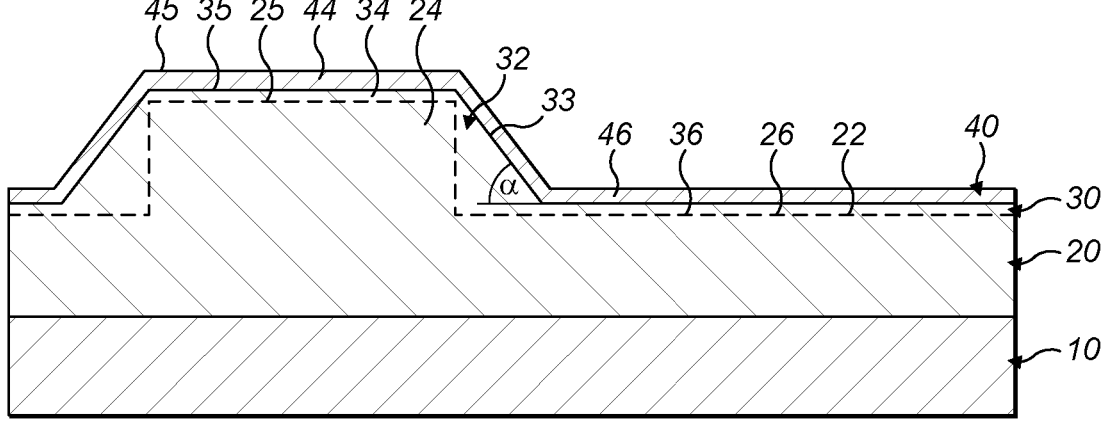
FIG. 2 shows a diagram of an intermediate step of a method according to an embodiment of the disclosure in which a first semiconducting layer with an overgrown second semiconducting layer is provided.

In one embodiment of the disclosure, as shown in FIG. 2, a second semiconducting layer 30 may be deposited on the first semiconducting layer 20. The second semiconducting layer 30 is formed on the first semiconducting layer 20 on an opposite side of the first semiconducting layer 20 to the substrate 10. As such, the second semiconducting layer 30 forms the first of the plurality of layers of the monolithic LED structure. For reference, FIG. 2 shows schematically the outline of the growth surface 22 of FIG. 1 as a dashed line.

The second semiconducting layer 30 may be formed on the growth surface 22 by any suitable growth method for the growth of Group III-nitrides. In the embodiment of FIG. 2, the second semiconducting layer 30 is formed monolithically over the growth surface 22 (i.e. an overgrowth method). The second semiconductor layer 30 may be formed as a continuous layer covering substantially the entire growth surface 22. The second semiconducting layer 30 may be deposited using any suitable process for the fabrication of Group III-nitride thin films, for example, Metal Organic Chemical Vapour Deposition (MOCVD), or Molecular Beam Epitaxy (MBE).

The second semiconducting layer 30 comprises a Group III-nitride. In the embodiment of FIG. 2, the second semiconducting layer 30 comprises GaN. The second semiconducting layer may be n-type doped. The GaN may be n-typed doped using a suitable dopant, for example Si, or Ge. In the embodiment of FIG. 2, the second semiconducting layer 30 is not intentionally doped. As such, the second semiconducting layer 30 may be a (substantially) undoped layer. By substantially undoped, it is understood that the Group III-nitride layer does not include any significant quantity of a dopant elements, whilst appreciating that some impurities may be present as a result of the fabrication process. As such, the substantially undoped Group III-nitride may be not intentionally doped.

By growing the second semiconducting layer 30 on the first semiconducting layer 20, the second semiconducting layer may have a crystal structure which corresponds to the crystal structure of the first semiconducting layer 20. For example, where the mesa surface 25 of the first semiconducting layer 20 is aligned with the (0001) plane of a Group III-nitride, the second semiconducting layer 30 may also be grown with a similar crystal orientation.

In the embodiment of FIG. 2, the second semiconducting layer 30 is formed on the growth surface 22 to provide an inclined sidewall portion 32 extending between a first portion of the second semiconducting layer 34 on the mesa surface 25 of the first semiconducting layer and a second portion of the second semiconducting layer 36 on the bulk semiconducting surface 26 of the first semiconducting layer. Accordingly, the second semiconducting layer 30 can be overgrown on the mesa structure 24 of the first semiconducting layer 20 to provide a Group III-nitride semiconducting layer comprising a second semiconducting layer mesa surface 35 and surrounded by inclined sidewall portions 33. As such, the second semiconducting layer 30 may be formed on a substrate surface of the substrate 10 to define an (n-type) mesa surface 35 which is parallel to the substrate surface, and an (n-type) side wall surface 33 surrounding the n-type mesa surface 35 which is inclined relative to the substrate surface.

As such, the second semiconductor layer 30 may be overgrown on the mesa structure 24 to form a column having a regular trapezoidal cross-section normal to the substrate, wherein the second semiconducting layer mesa surface 35 forms the substantially flat upper surface of the trapezoidal cross section. The second semiconducting layer mesa surface 35 may be aligned with plane parallel to the substrate surface on which the layers are formed.

By "regular trapezoidal cross-section" it is meant that the column is narrower at the top than the bottom and that it has a substantially flat upper surface, with sloped linear sides. This may result in a frustroconical shape, or more likely a frustropyramidal shaped having 3 or more sides, typically 6 sides. The description of "regular trapezoidal cross-section" refers to the first portion of the second semiconductor layer 34 grown over the mesa structure 24. The first portion of the second semiconductor layer 34 comprises a surface on an opposite side of the second semiconductor layer to the mesa structure 24. A first portion of the second semiconductor layer surface 35 is generally parallel to the mesa surface 24. The trapezoidal cross-section is the discontinuous portion of the second semiconductor layer extending above the continuous planar portion of the second semiconductor layer. The tapering sides of the trapezoidal cross section of the column are referred to herein as sidewall portions 33.

In some embodiments, the sidewall portions 33 of the columns have a substantially consistent angle ($\alpha$) to a plane parallel to the first semiconductor layer. That is, the angle between the side of the columns and a plane parallel to the first semiconductor does not change significantly. For example, the angle $\alpha$ is between 50° and 70°, more preferably it is between 58° and 64°, most preferably about 62°.

Accordingly, in some embodiments, the sidewall portions 33 of the columns may be inclined with respect to the (0001) plane of the crystal structure of the first semiconducting layer 20. The inclined sidewalls may generally be oriented along the $\{1\,\overline{1}\,0\,1\}$ or $\{1\,\overline{1}\,0\,2\}$ planes of the wurtzite crystal and present reduced polarisation fields compared with c-plane surfaces (semi-polar surfaces), similar to the structures produced by SAG.

In some embodiments, the column in the second semiconductor layer 30 is a truncated hexagonal pyramid.

As shown in FIG. 2, an active layer 40 may then be formed on the second semiconductor layer 30. The active layer 40 is configured to generate light of a first wavelength as part of the monolithic LED structure.

In the embodiment of FIG. 2, the active layer 40 may comprise one or more quantum well layers (not shown). As such, the active layer 40 may be a multiple quantum well layer. The plurality of quantum well layers are configured to output visible light. The quantum well layers within the active layer 40 may comprise a Group III-nitride semiconductor, preferably a Group III-nitride alloy including In. For example, in the embodiment of FIG. 2 the active layer 40 may comprise alternating layers of GaN and $In_zGa_{1-z}N$, where $0 < Z \leq 1$. The thickness and In content of the quantum well layer may be controlled in order to control the wavelength of light generated by the active layer. The active layer 40 may be formed as a continuous layer covering a substantial portion (e.g. all) of the exposed surface of the second semiconductor layer 30. The active layer 40 may be deposited using any suitable process for the fabrication of Group III-nitride thin films, for example, Metal Organic Chemical Vapour Deposition (MOCVD), or Molecular Beam Epitaxy (MBE).

The deposition of the active layer 40 on the second semiconductor layer 30 may occur with a relatively high deposition rate on the first portion of the second semiconducting layer surface 35 provided on the mesa surface 25, and with a significantly lower deposition rate on the inclined sidewalls 33. This effect results from the different crystal plane alignment of the various surfaces, resulting in a thicker active layer 40 over the mesa surface 25, 35 than on the inclined sidewalls 33. This effect is described in more detail in GB1811109.6.

Figure 3:
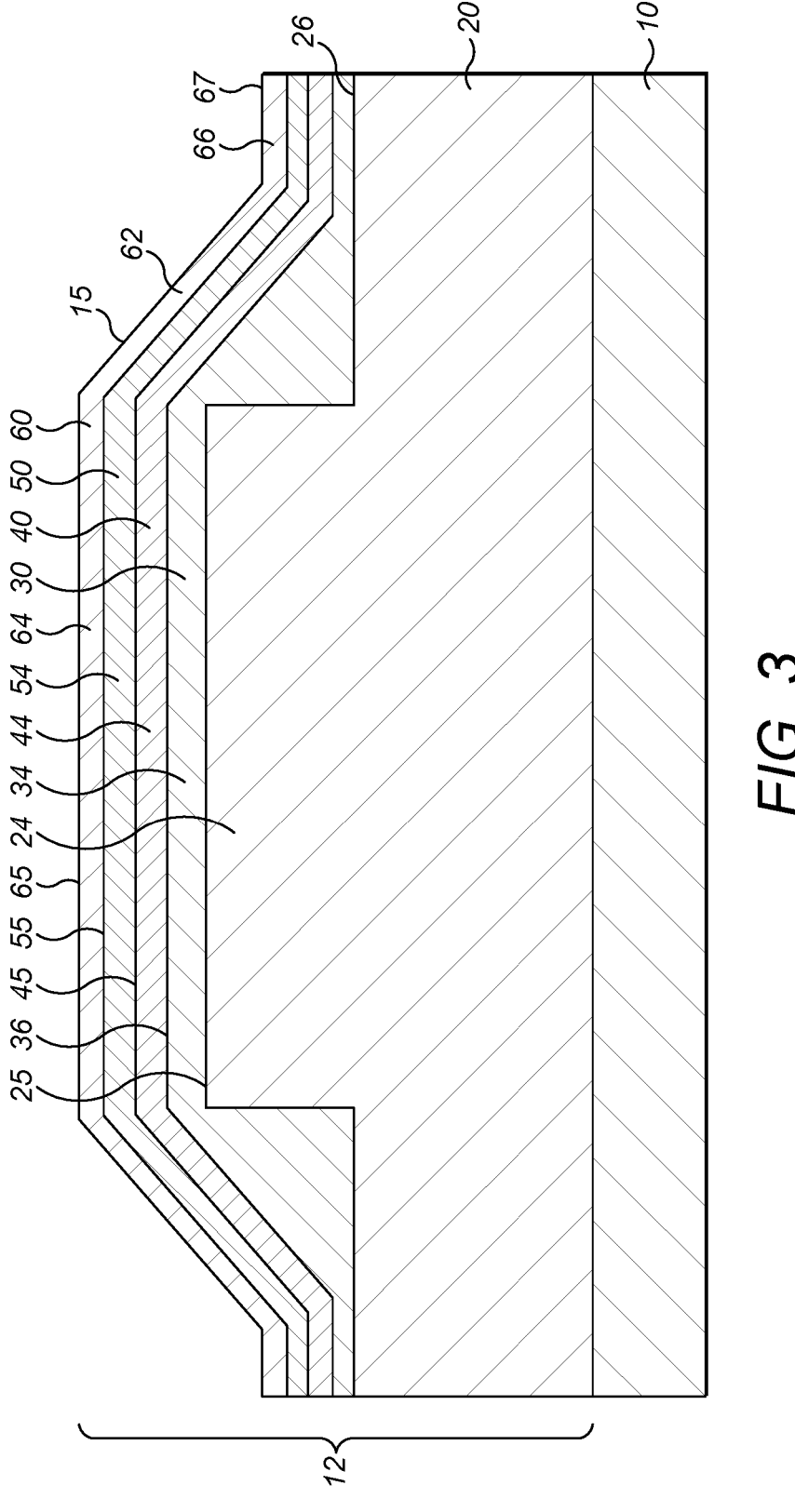
FIG. 3 shows a diagram of an intermediate step of a method according to an embodiment of the disclosure in which a LED stack is provided on a substrate.

Further layers of the LED stack 12 may then be deposited on the active layer 40 on an opposite side of the active layer 40 to the second semiconducting layer 30. FIG. 3 shows an example of a plurality of layers forming a LED stack 12. The plurality of layers of the LED stack 12 may each be formed as a continuous layer.

In the embodiment of FIG. 3, a second semiconducting layer 30 comprising undoped GaN is formed on the first semiconducting layer 20. The first semiconducting layer in FIG. 3 comprises n-type doped GaN. An active layer 40 is provided on the second semiconducting layer 30 as described above.

In the embodiment of FIG. 3, an electron blocking layer 50 is provided on the active layer 40. The electron blocking layer 50 is provided on a side of the active layer 40 opposite to a side of the active layer on which the second semiconducting layer 30 is provided. The electron blocking layer 50 comprises a Group III-nitride. The electron blocking layer 50 may be formed as a continuous layer covering a substantial portion (e.g. all) of the exposed surface of the active layer 40. The electron blocking layer 50 is configured to reduce electron flow from the active layer 30 into the p-type semiconducting layer 60 of monolithic LED structure. For example, in the embodiment of FIG. 3, the electron blocking layer 50 may comprise $Al_xGa_{1-x}N$. Further details of suitable electron blocking layers 50 may be found in at least Schubert, E. (2006). Light-Emitting Diodes. Cambridge: Cambridge University Press.

As shown in FIG. 3, a p-type semiconducting layer 60 is provided over the active layer 40. The p-type semiconducting layer 60 is provided on a side of the electron blocking layer 50 opposite the side of the electron blocking layer 50 on which the active layer 40 is provided. The p-type semiconducting layer 60 comprises a Group III-nitride. The p-type semiconducting layer is doped with a suitable electron acceptor, for example Mg. The p-type semiconducting layer 60 may be formed as a continuous layer covering a substantial portion (e.g. all) of the exposed surface of the active layer 40 (or electron blocking layer 50 if present).

Accordingly, the p-type semiconducting layer 60 may be provided with a first portion 64 which is substantially aligned with the mesa structure 24. That is to say, a surface of the first portion of the p-type semiconducting layer 65 is aligned is provided over the mesa surface 25 (i.e. the centres of the respective surfaces are aligned). The p-type semiconducting layer 60 also comprises a second portion 66 which covers at least a portion of the bulk semiconductor surface 26 away from the mesa surface 24. The second portion of the p-type semiconducting layer 66 includes a surface 67 which is aligned with the bulk semiconductor surface on an opposite side of the p-type semiconducting layer 60 to the bulk semiconductor surface 26. An inclined sidewall portion of the p-type semiconducting layer 62 extends between the first and second portions of the p-type semiconducting layer 64, 66.

Accordingly, a LED stack 12 comprising a plurality of Group III-nitride layers may be fabricated on substrate 10. Of course, it will be appreciated that the above described method is only one example of a method of forming a LED stack 12 according to this disclosure. Another example of a suitable method for forming a LED stack 12 is described in GB 1811109.6. As will be appreciated from the above description, the LED stack 12 may be formed having a generally columnar shape. That is to say, the column extends from the substrate 10 in a direction generally normal to the substrate. The column may have a cross section in the plane normal to the substrate surface which is generally a trapezium (e.g. a regular trapezoidal cross-section). For example, the LED stack 12 formed according to the method of FIGS. 1 to 3 comprises a regular trapezoidal cross-section.

Figure 4:
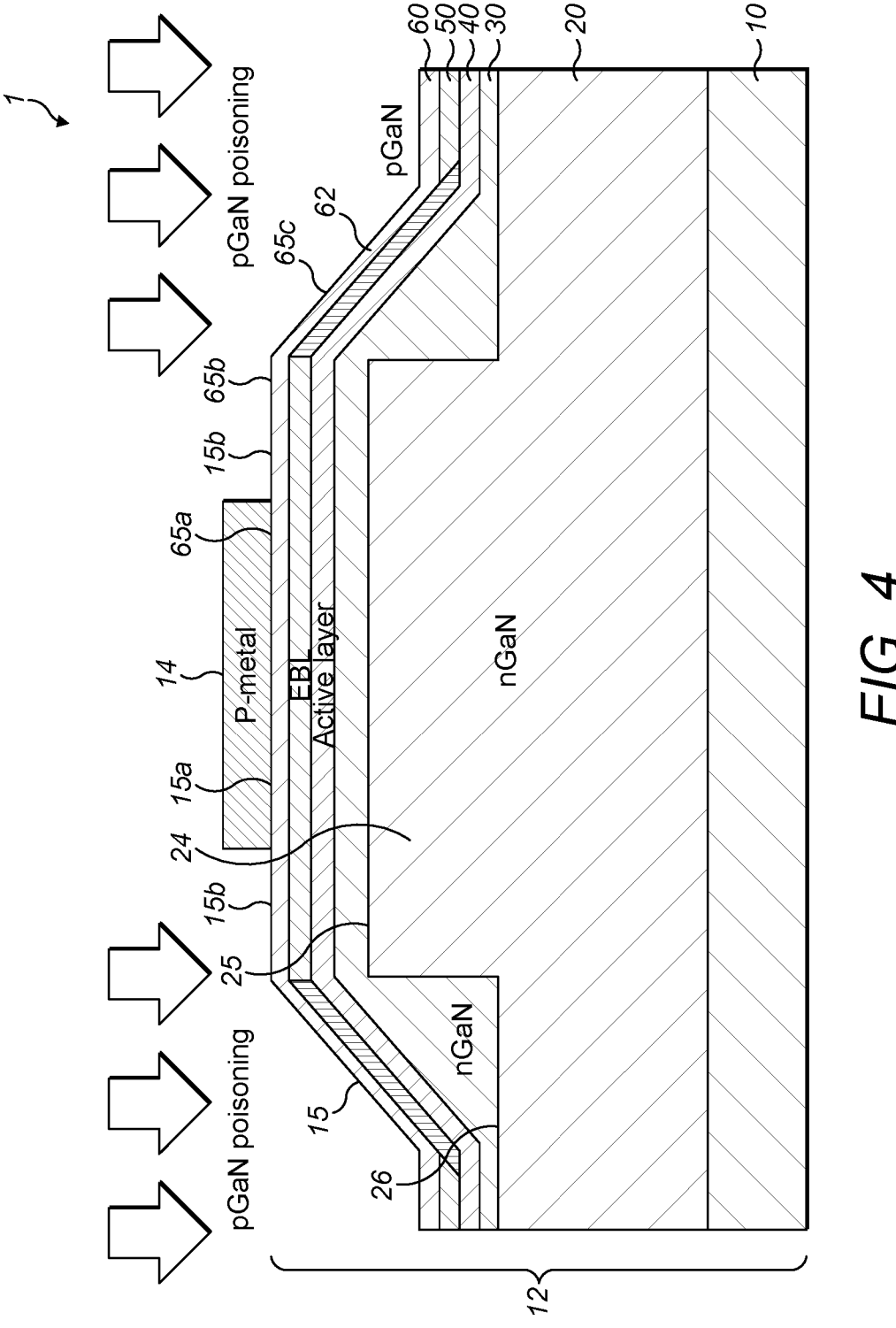
FIG. 4 shows a diagram of a first cross section A-A' of a LED stack undergoing a poisoning process according to an embodiment of the disclosure.

Following the formation of the LED stack 12, a contact layer 14 is formed on the LED stack 12. For example, as shown in FIG. 4 a contact layer 14 may be formed on a first portion of the LED stack surface 15 of the embodiment shown in FIG. 3. More specifically, the contact layer 14 may be formed on a first sub-portion of the surface of the first portion of the p-type semiconducting layer 65a (i.e. only partially covering the mesa surface of the p-type semiconducting layer 65). The contact layer 14 does not cover a second portion of the LED stack surface 15b. As such, a second portion of the LED stack surface 15b may be left exposed. In FIG. 4 a second sub-portion of the surface of the first portion of the p-type semiconductor layer 65b not covered by the covered by the contact layer 14 is exposed.

The contact layer 14 is configured to form an electrical contact to the LED stack 12. For example, in the embodiment of FIG. 4, the contact layer 14 is configured to form an Ohmic contact to the p-type semiconductor layer 60. The contact layer 14 may comprise a material suitable for forming an Ohmic contact to the LED stack 14. For example, in the embodiment of FIG. 4 the contact layer may comprise a metal such as Ti, Al, Ni, Pd, ITO and the like.

Following formation of the contact layer, the exposed second portion of the LED stack surface 15b may be subjected to a poisoning process. The poisoning process is configured to selectively increase the resistivity of at least one of the layers of the LED stack 12 in a region below the exposed second portion of the LED stack surface 15b.

In some embodiments, the poisoning process comprises subjecting the exposed second portion of the LED stack surface 15b to a surface treatment. The surface treatment process may selectively increase a resistivity of the p-type semiconducting layer 60 by compensation of holes in the p-type semiconducting layer 60. For example, exposure of the exposed second portion 15b of the LED stack (i.e. the exposed portions of the p-type semiconducting layer 65b to a plasma treatment process may compensate holes within the p-type semiconducting layer 60. The compensation of holes in the p-type semiconducting layer 60 increases the local resistivity of the p-type semiconducting layer in the compensated regions, whilst leaving the resistivity of the unexposed regions (i.e. the region of the p-type semiconducting layer below the first portion of the LED stack surface 15a) generally unchanged. Suitable plasma treatment processes include exposure to a Hydrogen plasma (i.e. a plasma comprising hydrogen ions), a $CF_4$ plasma, or a $CHF_4$ plasma. Other plasma treatments may also be suitable for the compensation of holes in Group III-nitrides.

The poisoning process is not limited to increasing the resistivity of only the p-type semiconductor layer but also other layers of LED stack. For example, in some embodiments the poisoning of the LED stack may penetrate through the layers of the LED stack 12. As such, in some embodiments, the second region of the LED stack may include second regions of: the electron blocking layer 50, the active layer 40, the second semiconducting layer 30, and the first semiconducting layer 20. Depending on the conditions of the poisoning process (e.g. duration) the depth that the poisoning process penetrates into the LED stack 12 may be controlled. Thus, while in some embodiments, only the p-type semiconducting layer 60 is poisoned, in other embodiments, the poisoning process may define a second region of the LED stack including second regions of e.g. the electron blocking layer 50, the active layer 40, and the second semiconducting layer 30. In particular, some LED stacks are prone to relatively high leakage currents between sidewall regions and the active layer 40. Thus, by poisoning a second region of the active layer 40, sidewall leakage currents resulting from the active layer may be reduced, thereby improving current confinement in the LED.

In some embodiments, a poisoning process may comprise subjecting an exposed second portion of the LED stack surface 15b to an ion implantation process. The contact layer 14 acts as a mask for the region of the LED stack 12 below the first portion of the LED stack surface 15a. As such, the ion implantation process may substantially only affect regions of the LED stack 12 below the exposed second portion of the LED stack surface 15b. The ion implantation process may not affect a region of the LED stack 12 below the first portion of the LED stack surface 15a covered by the contact layer 14. The ion implantation process may implant ions which increase the resistivity of the layer of the LED stack 12 in which the ions are implanted. It will be appreciated that depending on the energy of the ion implantation process, the ions may be implanted in a layer of the LED stack 12 below the p-type semiconducting layer 60. As such, the resistivity of regions of at least one of: the first semiconducting layer 20, the second semiconducting layer 30, the active layer 40, or the electron blocking layer 50 may be increased through the poisoning process.

Various ions may be implanted in the LED stack 12 to increase the resistivity of a region of the LED stack. For example, suitable ions to form relatively high resistivity regions includes H, N, He, Zn or C. Of course, the present disclosure is not limited to the above examples, and that other atoms, or molecules, may be used.

As a result of the poisoning process, the resistivity of regions of the LED stack 12 may be increased. For example, in the embodiment of FIG. 4, the p-type semiconducting layer 60 is exposed to a hydrogen plasma. The as-deposited p-type semiconducting layer 60 comprises p-type doped GaN. The as-deposited p-type semiconducting layer 60 may have a resistivity of about $0.5\Omega$ cm. Following the poisoning process, the regions of the p-type semiconducting layer 60 below the exposed second portion of the LED stack surface 15b may have a resistivity increase of at least 10 times the resistivity of the as-deposited resistivity value. For example, for an as-deposited p-type semiconductor layer having a resistivity of about 0.5 of $\Omega$ cm, the poisoning process may increase the resistivity to at least $5\Omega$ cm. In some embodiments, the poisoning process may increase the resistivity to no more than 10,000 times the resistivity of the as-deposited resistivity value. The unexposed regions of the p-type semiconducting layer, for example, the region of the p-type semiconducting layer below the contact layer 14, may have a resistivity which is generally unchanged from the as-deposited values.

By subjecting exposed regions of the LED stack surface 15b to a poisoning process, a second region of the LED stack 12 may have an increased local resistivity relative to a first region of the LED stack. Accordingly, the local resistivity of the LED stack 12 towards the inclined sidewall is increased. Thus, leakage currents through the sidewall regions may be reduced, as current flow from the central mesa portion of the LED stack to the sidewall regions is reduced.

Furthermore, in the embodiment of FIG. 4 the surface 65c of the inclined sidewall portions of the p-type semiconducting layer 62 are also exposed to the poisoning process. Thus, the inclined sidewall portions 62 of the LED stack (which typically have an as-deposited resistivity which is higher than the mesa portion of the LED stack 12) are also further poisoned. Thus, sidewall leakage currents may be further reduced by also exposing inclined sidewall portions of the p-type semiconducting layer 65c to the poisoning process.

In the embodiment of FIG. 4, only the first portion of the LED stack surface 15a covered by the contact layer 14 is not exposed to the poisoning process. As such, the second portion of the LED stack surface 15b which is exposed to the poisoning process includes the second sub-portion of the surface of the first portion of the p-type semiconductor layer 65b, the surface of the inclined sidewall portion of the p-type semiconducting layer 65c and the surface 67 of the second portion of the p-type semiconducting layer 66.

Following the poisoning process, a passivation layer 70 may be deposited on sidewall portions of the LED stack 12 to passivate surface states of the LED stack surface 15c. For example, in the embodiment of FIG. 5, a passivation layer 70 is deposited on the sidewall and bulk semiconductor regions of the LED stack to passivate the LED stack 12. The passivation layer is typically a dielectric layer such as SiN or SiO2 layer.

Figure 5:
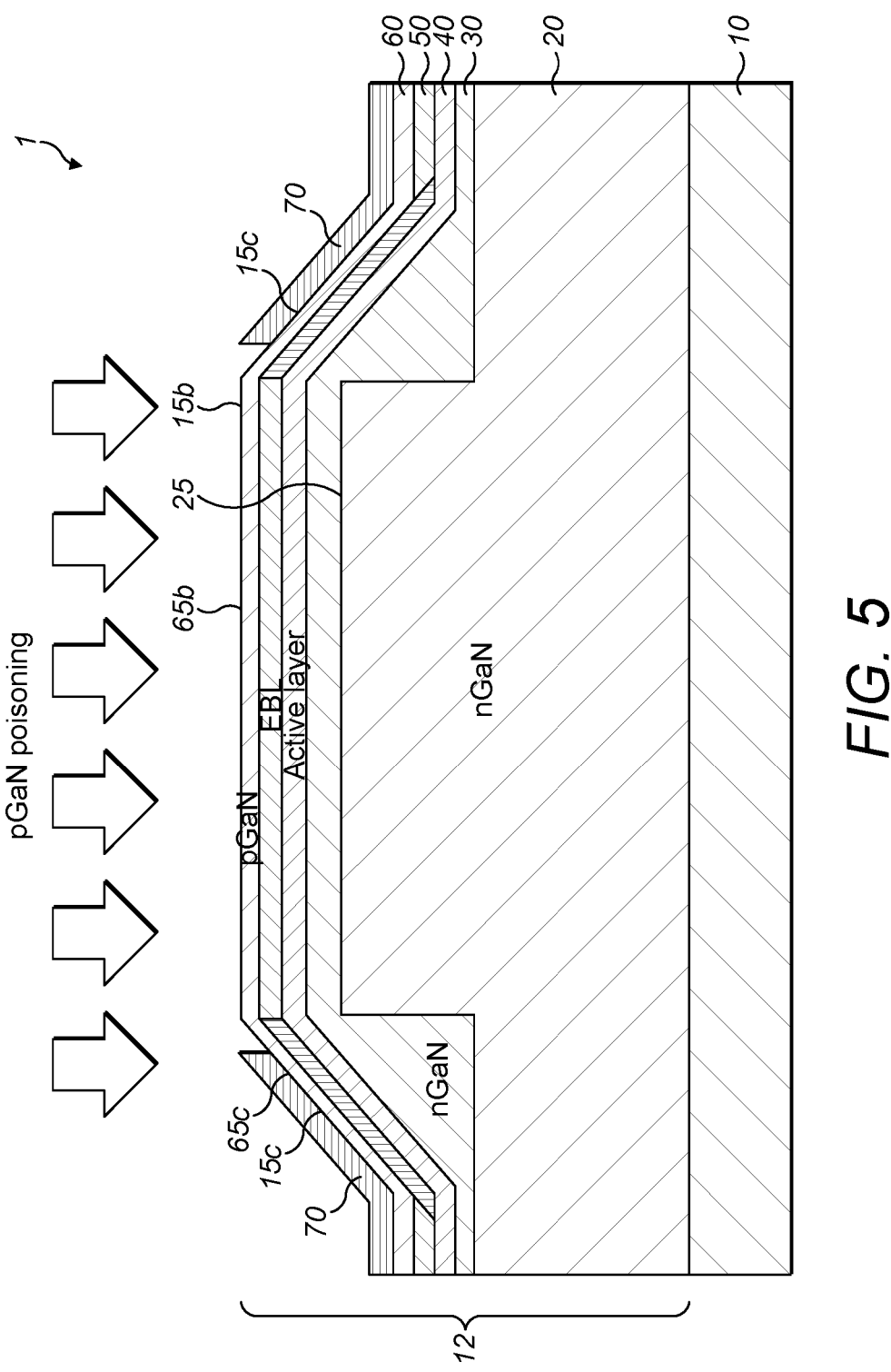
FIG. 5 shows a diagram of a second cross section A-A' of a LED stack undergoing a poisoning process according to an embodiment of the disclosure.

Whilst the embodiment of FIG. 5 only shows the passivation layer 70 covering sidewall portions of the LED stack 12, it will be appreciated that the passivation layer 70 may be provided to passivate other surfaces of the LED stack 12. In some embodiments, the passivation layer 70 may be provided to cover at least some of the second portion of the LED stack surface 15b or the contact layer 14 following the poisoning process. For example, the passivation layer 70 may be formed over the entire LED stack surface 15 and contact layer 14 of the embodiment of FIG. 4 following the poisoning process. Portions of the passivation layer 70 may then be selectively removed to provide access to the contact layer 14 for the formation of electrical contacts.

Figure 6:
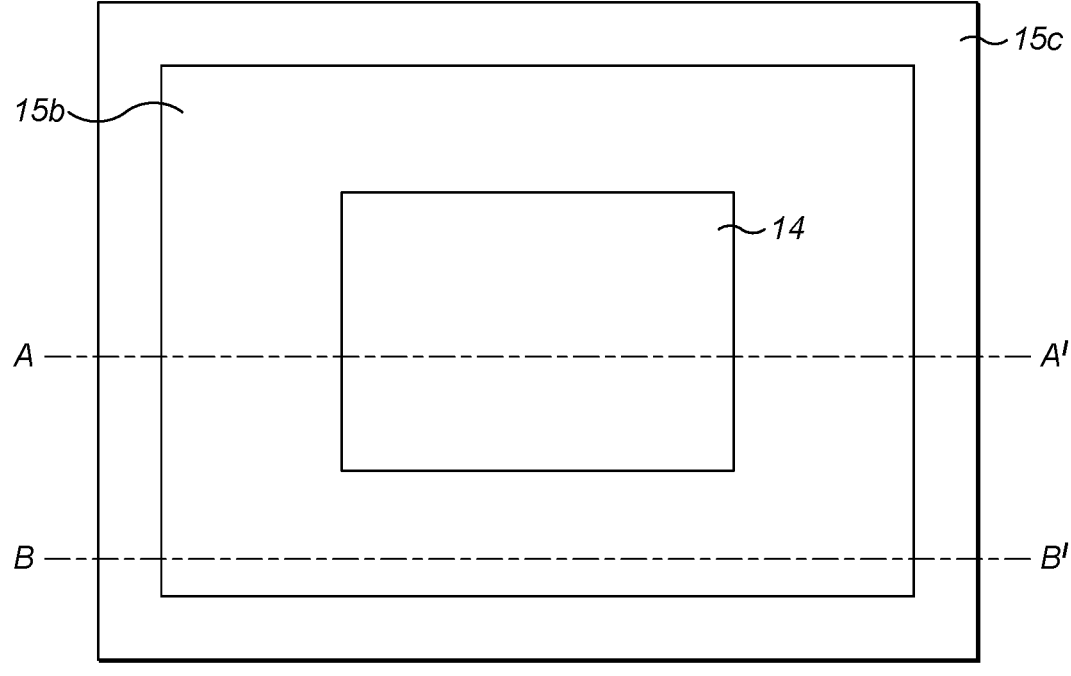
FIG. 6 shows a plan view of a LED stack surface.

FIG. 6 shows a plan view of the LED stack surface 15 from above the LED precursor. FIG. 6 shows the LED stack surface 15 including the contact layer 14 and the exposed second portion of the LED stack surface 15b. The inclined sidewalls of the LED stack 15c are also shown surrounding the LED stack surface. The cross section of the LED stack 12 shown in FIG. 4 is representative of the cross section of the LED stack 12 of FIG. 6 along the line A-A'. The cross section of the LED stack in FIG. 5 is representative of the cross section of the LED stack 12 of FIG. 6 along the line B-B'.

In the embodiment of FIG. 4, the contact layer 14 is used to, effectively, pattern the LED stack surface 15 for the poisoning process. In other embodiments, a masking layer (not shown) may be deposited instead of the contact layer. The masking layer may be used in a similar manner to the contact layer 14 to define first and second portions of the LED stack surface 15a, 15b for the poisoning process. Following the poisoning process, the masking layer may be removed and the contact layer 14 may be deposited. By using a masking layer to define the first and second portions of the LED stack surface 15a, 15b, the contact layer may be subsequently deposited with a different shape (pattern) to the first portion of the LED stack surface 15a.

The masking layer may be provided to define a plurality of regions of the LED stack 12 which are not to be subjected to the poisoning process. The masking layer may be formed using any suitable technique, such as lithography, for defining a patterned masking layer. The masking layer may comprise any suitable masking material. For example, in some embodiments the masking layer may comprise $SiO_2$.

Figure 7A:
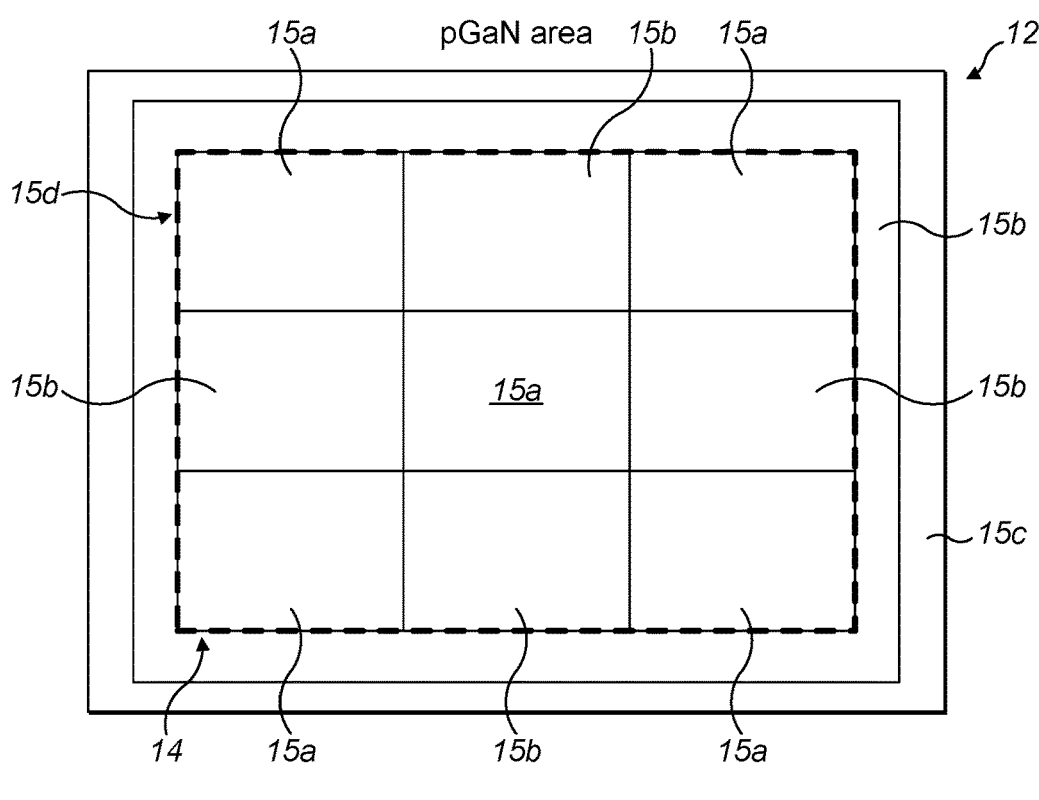
FIG. 7a shows a plan view of a LED stack surface having a chequerboard pattern.

FIG. 7a shows a further plan view of a LED precursor of an LED stack surface 15 which has been patterned with a masking layer to define a plurality of first and second regions 15a, 15b according to an embodiment of the disclosure. FIG. 7a shows a plan view first portion of the p-type semiconducting layer 65 of the LED precursor viewed from above the LED stack surface 15, prior to the formation of a contact layer 14. In the embodiment of FIG. 7a, the LED stack surface 15 is patterned in order to define a plurality of second portions of the LED stack surface 15b and a plurality of first portions of the LED stack surface 15a.

The LED stack surface 15 of FIG. 7a is patterned to include a chequerboard pattern in a patterned are of the LED stack surface 15d. The patterned area 15d includes a plurality of first and second portions of the LED stack surface 15a, 15b. The patterned area is configured to define a pattern of second LED stack portions for distributing current to reduce hotspots. In the embodiment of FIG. 7a, the contact layer 14 would be formed over the patterned area 15d (shown in FIG. 7a which a dashed line). The patterned area 15d is encircled by a current leakage perimeter area 15e. The current leakage perimeter area is an annular shaped area which is not masked (i.e. a second portion of the LED stack surface 15b). The current leakage perimeter area 15b is arranged to reduce leakage currents from the sidewall regions of the LED stack.

Whilst in the embodiment of FIG. 7a, a masking layer (not shown) is used to form the pattern, in other embodiments, the contact layer 12 could be used to form the pattern. In other embodiments, a combination of the contact layer 12 and a masking layer may be used to define the pattern on the LED stack surface 15 for the poisoning process.

It will be appreciated that the LED stack surface 15 of FIG. 7a is patterned in order to define one or more exposed second portions of the LED stack surface 15b. In the embodiment of FIG. 7a, the first and second portions of the LED stack surface 15a, 15b are arranged to define a chequerboard pattern for the exposed second portions of the LED stack surface 15b. Accordingly, the regions of the LED stack 12 which have increased resistivity following the poisoning process may be distributed across the surface area of the LED stack 12. Thus, the flux density of light generated by the LED during use may be more evenly distributed across the surface area of the LED resulting in a reduction in hotspots.

Figure 7B:
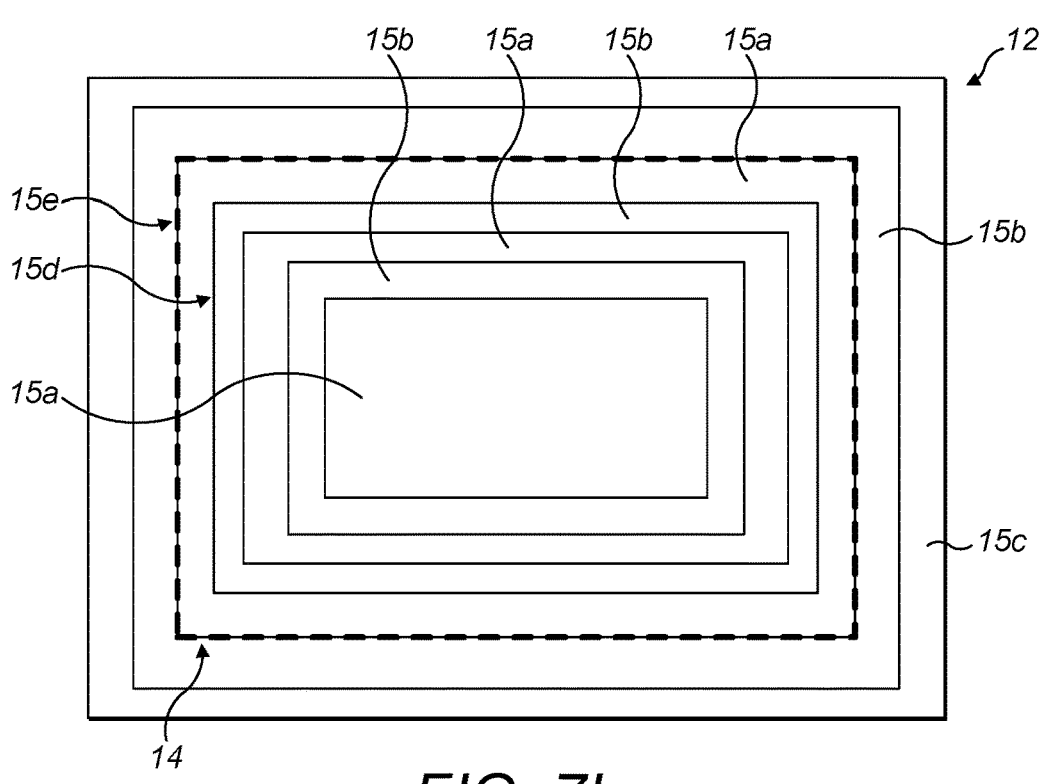
FIG. 7b shows a plan view of a LED stack surface having an annular pattern.

Whilst the embodiment shown in FIG. 7a includes a chequerboard pattern, it will be appreciated that in other embodiments, the LED stack surface 15 may be patterned with a variety of different patterns. For example, in FIG. 7b, the LED stack surface 15 is patterned with a patterned area 15d and a current leakage perimeter area 15e. In the embodiment of FIG. 7b, the patterned area 15d defines a pattern comprising a plurality of annular portions encircling a central portion. As such, the first and second portions of the LED stack surface 15a, 15b may be arranged to define a plurality of annular shaped second portions of the LED stack surface 15b. In the embodiment of FIG. 7b, the annular shaped second portions of the LED stack surface 12 are arranged concentrically about a central sub portion of the first portion of the LED stack surface 15a. The annular shaped second portions 15b are spaced apart from each other with about equal spacing (i.e. spaced apart by annular shaped sub portions of the first portion of the LED stack surface 15*a*).

Similar to the embodiment of FIG. 7*a*, the contact layer 14 (shown by dashed line) may be formed on the patterned area 15*d* of the embodiment of FIG. 7*b* following the poisoning process.

It will be appreciated that the embodiment of FIG. 7*b* is one possible example of annular shaped second portions of the LED stack surface 15*b*. Whilst the embodiment of FIG. 7*b* comprises annular portions which are rectangular, in other embodiments, the annular portions may be generally elliptical, triangular, pentagonal, hexagonal, or any other form of polygon. That is to say, the annular-shaped second portions of the LED stack 15*b* may have any suitable shape.

Accordingly, the above described method may provide a light emitting diode (LED) precursor. A LED precursor formed by the above methods comprises LED stack 12. In some embodiments, the LED precursor may be provided on a substrate 10 (i.e. on a substrate surface of the substrate 10). In other embodiments, the substrate 10 may be removed. In such embodiments, the LED stack 12 may be arranged to emit light from a light emitting surface 21 on an opposite side of the LED to the LED stack surface 15.

In some embodiments, the LED stack 12 comprises a plurality of layers provided on the substrate surface. The LED stack comprises a first semiconducting layer 20 comprising a Group III-nitride provided on the substrate surface, an active layer 40 comprising a Group III-nitride provided on the first semiconducting layer 20, and a p-type semiconducting layer 60 comprising a Group III-nitride provided on the active layer 40, and a contact layer 14. A major surface 65 of the p-type semiconducting layer 60 on an opposite side of the p-type semiconducting layer 60 to the active layer provides an LED stack surface 15 of the LED stack 12.

The contact layer 14 is provided on a first portion of the LED stack surface 15*a* which covers a first portion of the p-type semiconducting layer 65, the contact layer defining a first region of the LED stack below the contact layer 14. An exposed second portion of the LED stack surface 15*b* defines a second region of the LED stack 14 below the exposed second portion of the LED stack surface 15*b* in which a resistivity of at least one of the plurality of layers of the LED stack 12 is increased relative to a resistivity of the respective layer of the LED stack in the first region of the LED stack 12.

For example, in the embodiment of FIG. 6 (with reference to the cross-sections of FIGS. 4 and 5) a LED precursor is provided. The LED precursor comprises a substrate 10, a LED stack 12, and a contact layer 14

The LED stack 12 of FIG. 6 comprises a first semiconducting layer 20, a second semiconducting layer 30, an active layer 40, an electron blocking layer 50 and a p-type semiconducting layer 60. The arrangement of the Group III-nitride layers of the LED stack 12 is described in more detail above. Of course, in other embodiments, other combinations of Group III-nitride layers may be used to form an LED stack 12.

As shown in FIG. 4, the LED stack 12 comprises a column having a regular trapezoidal cross-section in a plane normal to the substrate surface 10.

The contact layer 14 is provided on a first portion of the LED stack surface 15*a* which covers a first portion of the p-type semiconducting layer 65*a*. The contact layer defines a first region of the LED stack 12 below the contact layer 14.

A second portion of the LED stack surface 15*b* defines a second region of the LED stack 12 below the second portion of the LED stack surface 15*b* in which a resistivity of at least one of the plurality of layers of the LED stack 12 is increased relative to a resistivity of the respective layer of the LED stack in the first region of the LED stack 12. In some embodiments, such as in FIG. 6, the second portion of the LED stack surface 15*b* may be exposed. Of course, in other embodiments, the second portion of the LED stack surface 15*b* may be covered by further material of the LED precursor, for example a gap-filling insulator.

In some embodiments, for example such as the arrangement of FIG. 6 (and also FIGS. 7*a* and 7*b*), the second portion of the LED stack surface 15*b* may encircle the first portion of the LED stack surface 15*a*.

In some embodiments, a passivation layer 70 may also be deposited on the sidewall portions of the LED stack 14. As such, the sidewall portions of the LED precursor may be similar to the embodiment of FIG. 7 above. Passivation layer 70 is discussed in more detail above. The passivation layer may also cover some parts or the entire of LED stack surface 15*b* during subsequent post poisoning process steps as explained above.

Accordingly, a LED precursor 1 having improved flux distribution when in use may be provided. Such LED precursors may generate light which is more evenly distributed across the light emitting surface of the LED. This in turn may reduce or eliminate the presence of hotspots on the light emitting surface 21.

The LED precursor of FIG. 4 may be subjected to further processing steps in order to form a LED.

Figure 8:
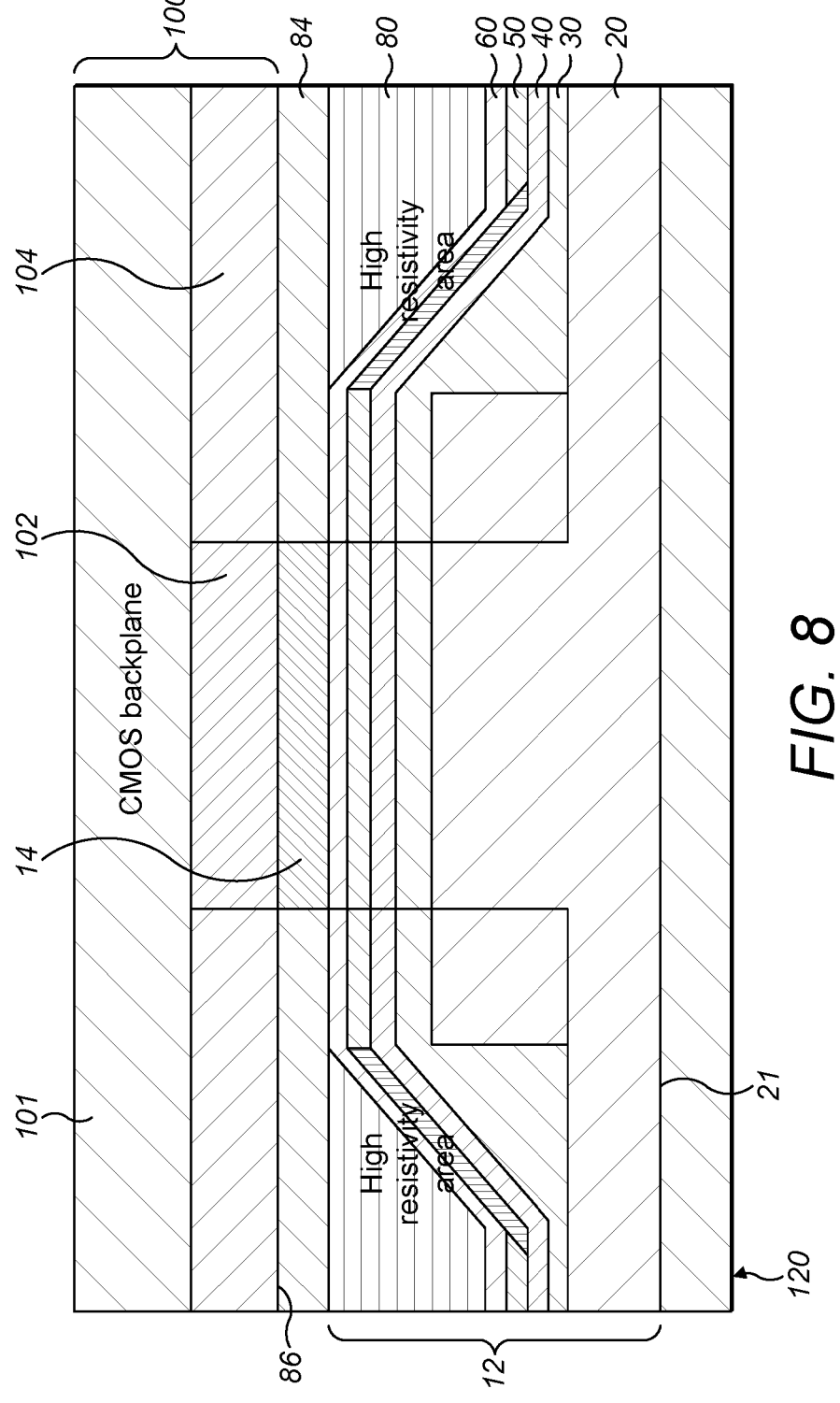
FIG. 8 shows a diagram of a LED bonded to a backplane electronics substrate according to an embodiment of the disclosure.

For example, in some embodiments, the substrate 10 may be removed from the LED precursor. An example of a LED according to an embodiment of the disclosure is shown in FIG. 8. In the embodiment of FIG. 8, the LED precursor of FIG. 4 has been further processed to remove the substrate 10 and to bond the LED precursor to a backplane electronics substrate 100. Following removal of the substrate 10, a transparent conducting oxide 120 has been deposited on the light emitting surface 21 of the first semiconducting layer 20.

Prior to bonding the backplane electronics substrate to the LED precursor, the LED stack surface may be planarised with a gap filling insulator 80 and a first bondable dielectric layer 84. The gap filling insulator 80 may act as a passivation layer to passivate surface states of the LED stack 12 (similar to the passivation layer 70 in the embodiment of FIG. 5). The first bondable dielectric layer 84 provides a planar bonding surface 86 which is aligned with the contact layer 14. The bondable dielectric layer 84, and the gap filling insulator 80 may comprise $SiO_2$, or $SiN_x$ or any other suitable dielectric.

The backplane electronics substrate 100 may comprise contact surfaces and control electronics configured to provide power to the LED. A bonding surface of the backplane electronics substrate 100 may comprise a second bondable dielectric layer 104 and a backplane contact layer 102. Such a backplane electronics substrate 100 may be provided for bonding using a variety of methods for preparing a substrate for bonding known to the skilled person. In the embodiment of FIG. 8, the backplane contact layer 102 may be aligned with the contact layer 14. The bonding surface of the backplane electronics substrate and the bonding surface 86 of the LED precursor may then be brought into contact. The application of temperature and/or pressure may then promote the formation of bonds between the two bondable dielectric layers 84, 104 and the contact layers 14, 102.

Further details of methods suitable for bonding a backplane electronics substrate 100 to a Group III-nitride LED are described in GB 1917182.6.

Next, some alternative arrangements for the LED stack 12 and the poisoning process will be described.

In the above embodiments, the contact layer 14 may be used to form part of the layer for patterning the LED stack surface 15 for the poisoning process. In some embodiments, a masking layer may be used to pattern the LED stack surface 15 prior to formation of the contact layer 14.

Figure 9:
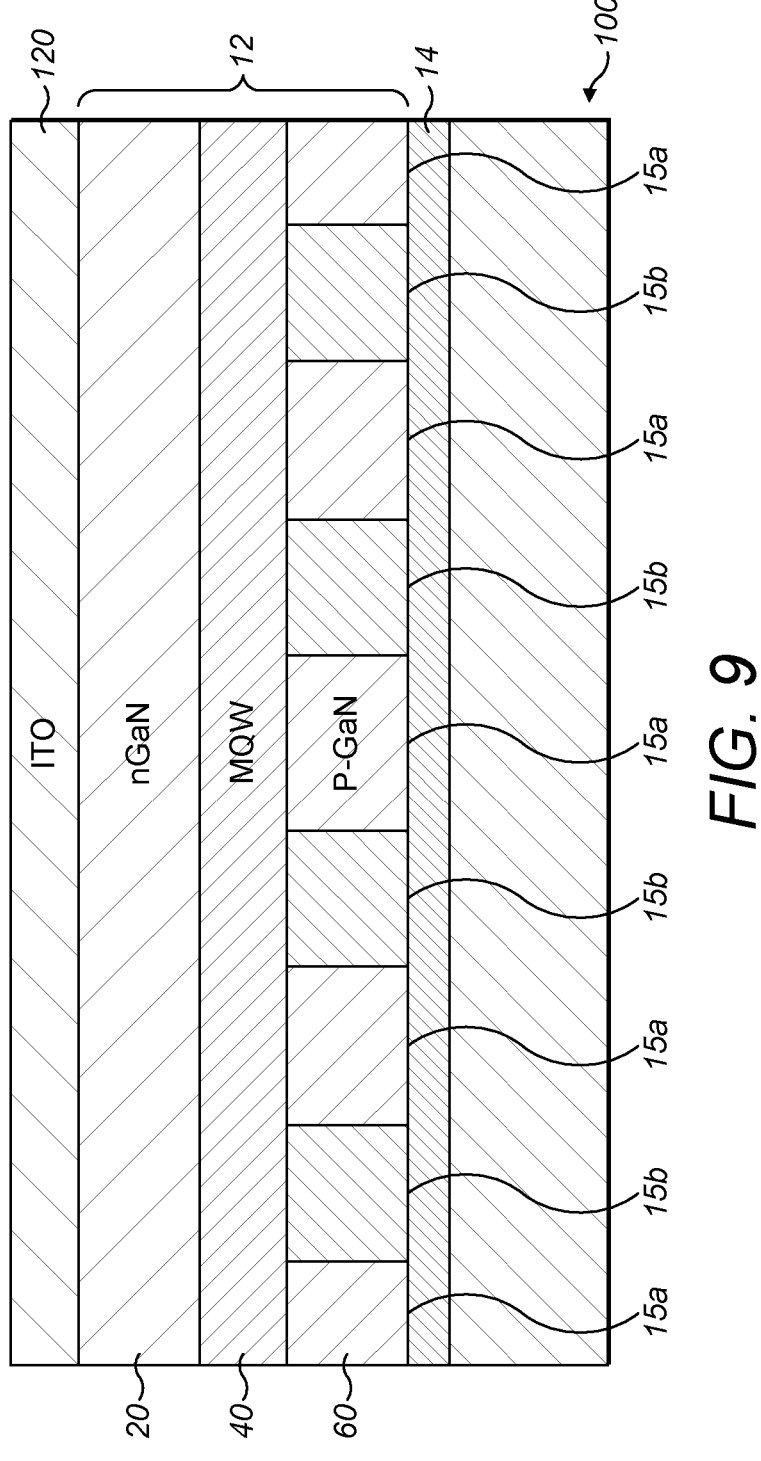
FIG. 9 shows an embodiment of a LED precursor in which a masking layer has been used to define a plurality of first portions of a LED stack surface.

For example, FIG. 9 shows an embodiment of a LED precursor in which a masking layer (not shown) has been used to define a plurality of first portions of a LED stack surface 15a. The exposed second portions of the LED stack surface 15b have subsequently been subjected to a poisoning process in order to increase the resistivity of the p-type semiconducting layer 60 in the regions of the p-type semiconducting layer 60 corresponding to the second portions of the LED stack surface 15b. The regions of the p-type semiconducting layer 60 corresponding to the first portions of the LED stack surface may have a resistivity which is substantially the same as the as-deposited p-type semiconducting layer 60.

Following the poisoning process, in the embodiment of FIG. 9 the masking layer is removed and a contact layer 14 is deposited across the LED stack surface 15. As such, the contact layer 14 covers both the first and second portions of the LED stack surface 15a, 15b.

The masking layer (not shown) used to define the first and second portions on the LED stack surface 15 may have any suitable pattern. For example, the masking layer may be arranged in a chequerboard pattern such as shown in FIG. 7a, or an annular pattern such as shown in FIG. 7b. Accordingly, the masking layer may be used to define a pattern for the LED stack surface 15 which aims to reduce the formation of hotspots in the active layer 40 when the LED is in use.

In a further embodiment of the disclosure, the leakage currents around the periphery of the LED stack 12 may be further reduced by including an insulating sublayer in the LED stack 12 on an n-type side of the LED stack 12. The insulating sublayer 28 is formed as part of the first semiconducting layer 20. The insulating sublayer 28 comprises an aperture through the insulating sublayer 28. The aperture is aligned with the LED stack 12 to guide charge carriers towards a central portion of the LED stack 12 and to reduce leakage currents around the periphery of the LED stack 12.

Figure 10:
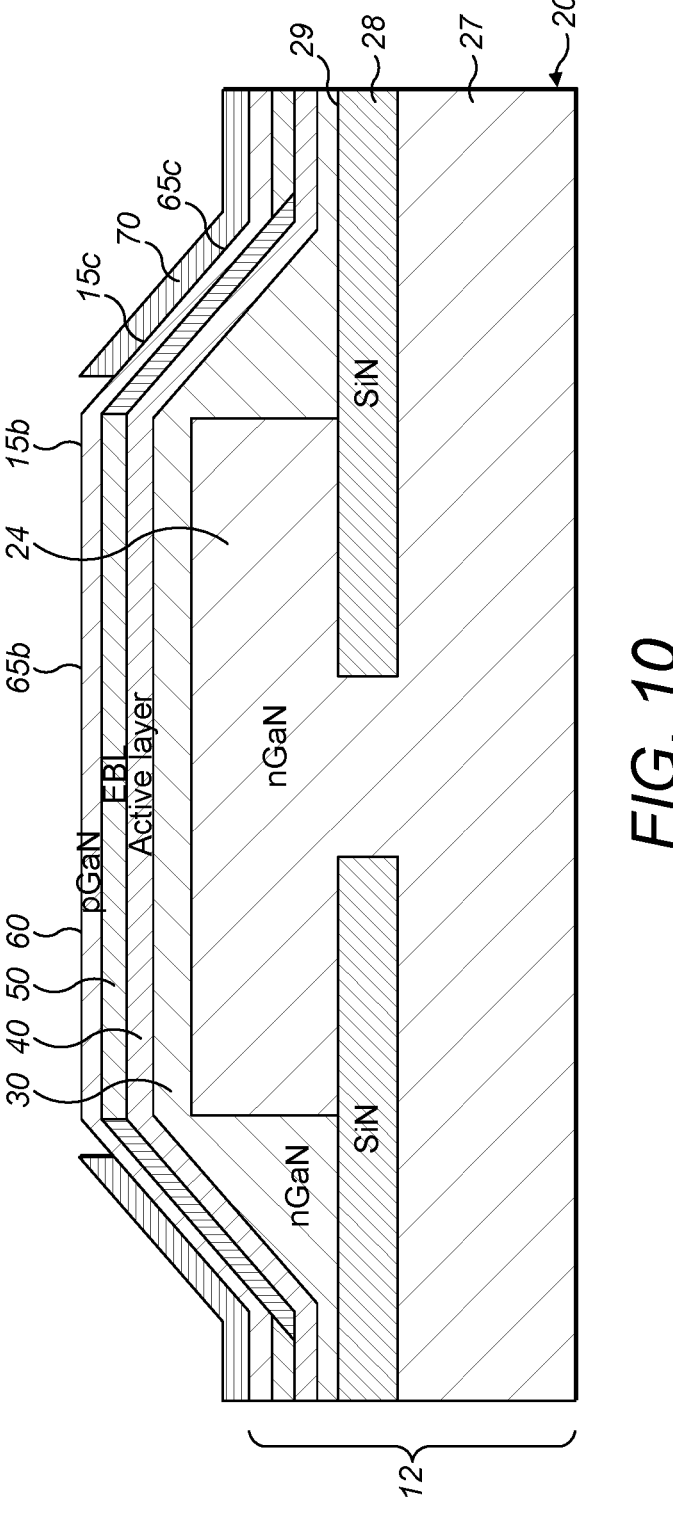
FIG. 10 shows a cross section of a LED precursor having an insulating sublayer.

For example, in the embodiment of FIG. 10, the first semiconducting layer 20 comprises a first semiconducting sublayer 27, the insulating sublayer 28, and a second semiconducting sublayer 29.

The first semiconducting sublayer 27 comprises a Group III-nitride. The first semiconducting sublayer 27 is formed on the substrate surface. The first semiconducting sublayer 27 may be formed in substantially the same manner as the first semiconducting layer 20 described above.

The insulating sublayer 28 is formed on the first semiconducting sublayer 27. The insulating sublayer is formed as a substantially continuous layer across the first semiconducting sublayer 27. An aperture is subsequently formed through the thickness of the insulating sublayer such that the first semiconducting sublayer 27 is exposed. The aperture surface area in the plane of the insulating sublayer 28 is no greater than the surface area of the LED stack surface 12. In some embodiments, the surface area of the aperture is no greater than 50% of the surface area of the LED stack surface 12. The aperture may be generally centred about a centre of the LED precursor in the plane of the LED surface 12.

Figure 11:
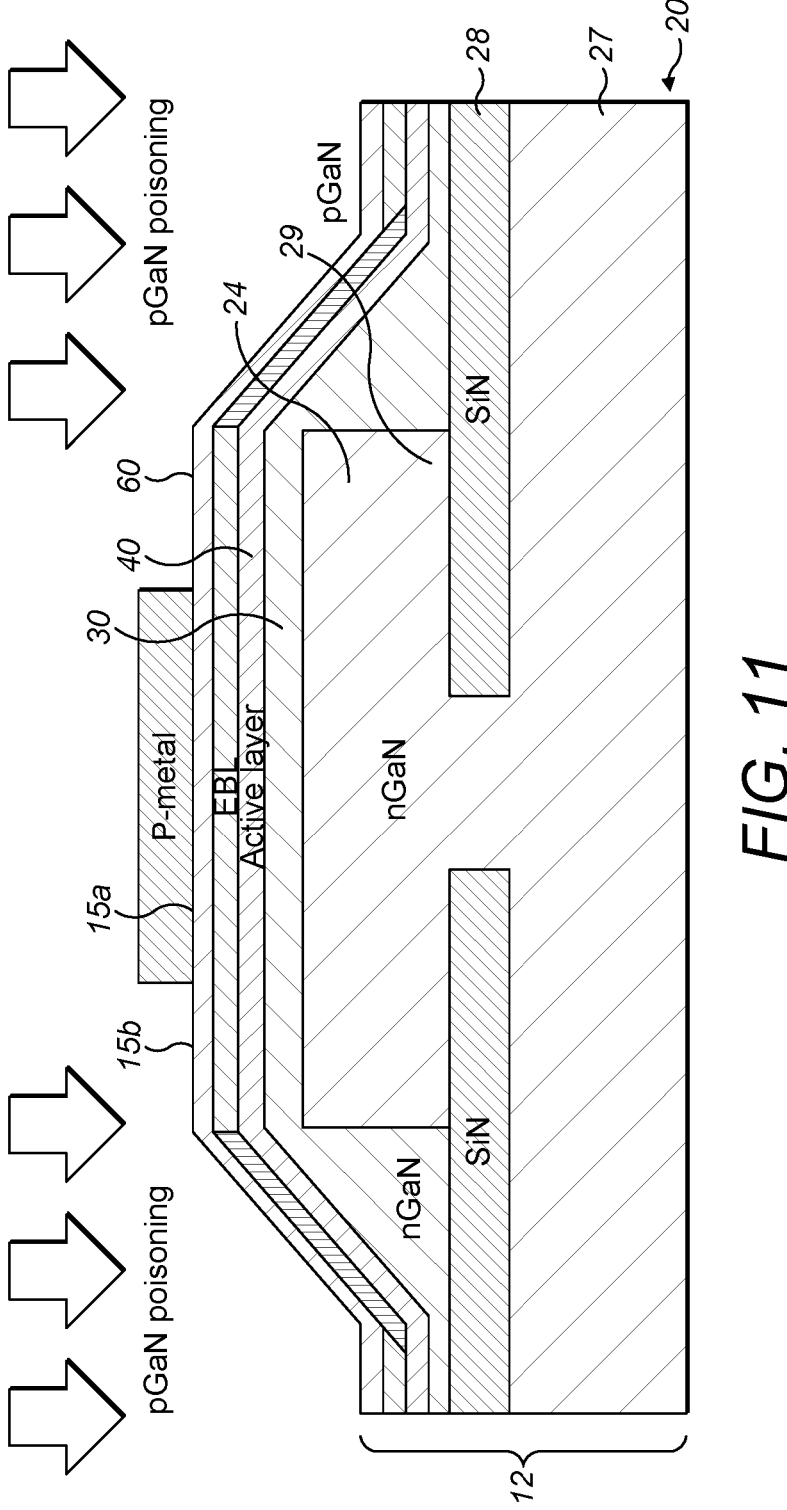
FIG. 11 shows a further cross section of a LED precursor having an insulating sublayer.

The second semiconducting sublayer 29 is formed on the insulating sublayer 28, and also within aperture of the insulating sublayer 28. The second semiconducting sublayer 29 comprises a Group III-nitride on the insulating sublayer. The second semiconducting sublayer 29 may comprise the same Group III-nitride as the first semiconducting layer 27. The second semiconducting layer 29 may be formed across the insulating sublayer 28 as a substantially continuous layer in order to provide a growth surface 22 of the first semiconducting layer 20 as described above. Thus, when forming the LED precursor according to the embodiments of FIGS. 10 and 11, selectively removing a portion of the first semiconducting layer 20 to form a mesa structure 24 comprises selectively removing a portion of the second semiconducting sublayer 29 to form a mesa structure 24 which is aligned with the aperture of the insulating sublayer 28.

Following the formation of the mesa structure 24, the other layers of the LED stack 12 may be formed in a manner similar to the method discussed above for the embodiments of FIGS. 1 to 6.

Figure 12:
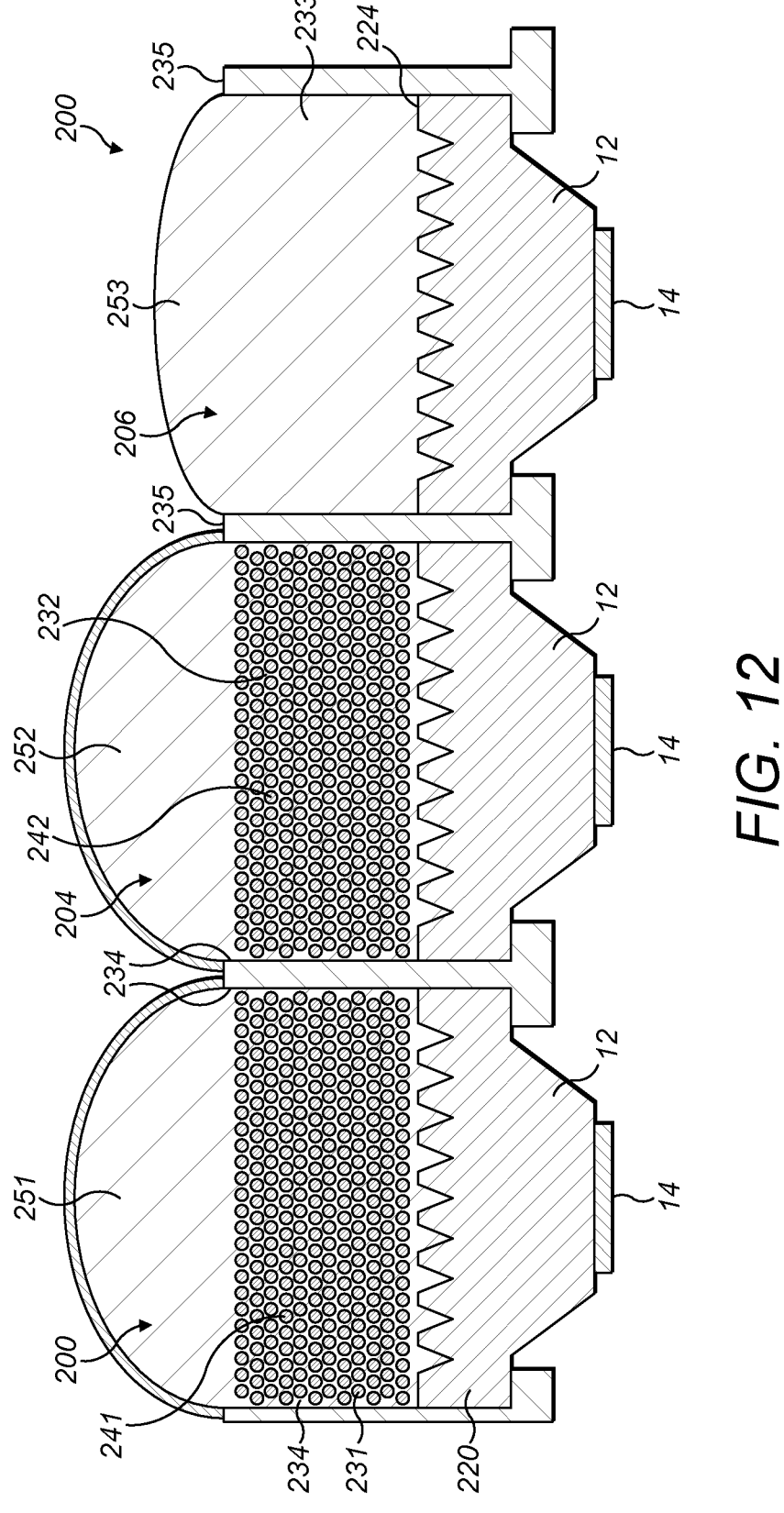
FIG. 12 shows a diagram of a LED array including a colour converting layer according to an embodiment of the disclosure.

According to an embodiment of the disclosure, an LED precursor may be formed into a LED comprising a colour converting material. For example, FIG. 12 shows a diagram of an array of LEDs 200 formed from a plurality of LED precursors according to embodiments of the disclosure. The LED array shown in FIG. 12 comprises a green LED 202, a red LED 204, and a blue LED 206.

The LED array 200 comprises a light generating layer 220. The light generating layer 220 includes an array LEDs, wherein each semiconductor junction configured to output pump light is formed from an LED precursor according to this disclosure.

As shown in FIG. 12, the LED array 200 includes a container layer 230. The container layer 230 is provided on the light emitting surface of the light generating layer 220. The container layer 230 includes a plurality of inner sidewalls 234 which define a plurality of container volumes 231, 232, 233 on the light emitting surface 224 of the light generating layer 220. Each container volume is provided though the container layer (i.e. through the thickness of the container layer 230). As such, each container volume 231, 232, 233 extends from an opening in a container surface 235 of the container layer through the light emitting surface 224.

As shown in FIG. 2, at least one of the container volumes 231, 232 may selectively include a colour converting layer 241. In the embodiment of FIG. 12, a first (green) container volume 231 includes a first (green) colour converting layer 241. A second (red) container volume 232 includes a second (red) colour converting layer 242. Each colour converting layer is configured to convert pump light into converted light of a different wavelength. For example, the first colour converting layer 241 may be configured to convert pump light into green visible light, while the second colour converting 242 layer may be configured to convert pump light into red visible light. As such, colour converting layers may be configured to convert pump light having a wavelength of at least 440 nm and/or no greater than 480 nm. The first colour converting layer 241 may convert the pump light to converted light having a wavelength of at least 500 nm and/or no greater than 560 nm. The second colour converting layer 242 may convert pump light to converted light having a wavelength of at least 590 nm and/or no greater than 650 nm.

In some embodiments, the colour converting layers 241, 242 may comprise quantum dots. In some embodiments the colour converting layers 241, 242 may comprise phosphors. In some embodiments, the colour converting layers 241, 242 may comprise a combination of phosphors and quantum dots. For LEDs, and LED arrays having container volumes with a surface area in excess of 1 mm², the larger particle size of phosphors may be advantageous. For LEDs and LED arrays having container volumes with surface areas less than 1 mm², for example micro LEDs, it may be advantageous to use a colour converting layer comprising quantum dots, due to the smaller particle size. Colour converting materials, including quantum dots are known to the skilled person. Further details of suitable quantum dots for use as a colour converting layer may be found in at least "Monolithic Red/Green/Blue Micro-LEDs with HBR and DBR structures" Guan-Syun Chen, et. al.

As shown in FIG. 12, the colour converting layer 241, 242 may extend across the container volume 231, 232. The container volume 231, 232 is at least partially filled by the colour converting layer.

As shown in FIG. 12, at least one of the container volumes 233 of the LED array 200 may not include any colour converting layer. Thus, some LEDs in the LED array 200 may output pump light through the unfilled container volume. For example, where the pump light is blue visible light, a container volume may not include a colour converting layer in order to provide a blue LED 300.

As shown in FIG. 12, a lens 251 may also be provided on the container surface 235 over the opening covering the first colour converting layer 241. The lens 251 has a convex surface on an opposite side of the lens to the first colour converting layer 241. The lens may be provided in order to reduce the amount of converted light which is totally internally reflected at the interface between the LED and the outside environment.

Further details regarding the provision of a LED comprising a colour converting layer may be found in GB 1911008.9.

Accordingly, a LED precursor and a method of forming a LED precursor may be provided in accordance with the embodiments discussed above. It will be appreciated that this disclosure is not limited to the embodiments described above, and various modifications and variations will be apparent to the skilled person from the appended claims.

The invention claimed is:

1. A method of forming a Light Emitting Diode (LED) precursor comprising:

forming a LED stack comprising a plurality of Group III-nitride layers on a substrate, the LED stack comprising a LED stack surface formed on an opposite side of the LED stack to the substrate;

masking a plurality of first portions of the LED stack surface with a masking layer leaving a plurality of second portions of the LED stack surface exposed;

subjecting the plurality of second portions of the LED stack surface to a poisoning process such that a plurality of second regions of the LED stack below the second portions of the LED stack surface comprising at least one of the Group III-nitride layers of the LED stack has a relatively higher resistivity than a resistivity of the respective Group-III nitride layer in a plurality of first regions of the LED stack below the first portion of the LED stack surface; and removing the masking layer and forming a contact layer covering the plurality of first and second portions of the LED stack surface.

2. A method of forming a LED precursor according to claim 1, wherein forming the LED stack comprises:

forming a first semiconducting layer comprising a Group III-nitride on the substrate;

forming an active layer comprising a Group III-nitride on the first semiconducting layer; and forming a p-type semiconducting layer comprising a Group III-nitride on the active layer, wherein a major surface of the p-type semiconducting layer on an opposite side of the p-type semiconducting layer to the active layer provides an LED stack surface of the LED stack.

3. A method according to claim 2, wherein the plurality of second regions of the LED stack includes a plurality of second regions of the p-type semiconducting layer, and the plurality of first regions of the LED stack includes a plurality of first regions of the p-type semiconducting layer.

4. A method according to claim 2, wherein the plurality of second regions of the LED stack includes a plurality of second regions of the active layer; and the plurality of first regions of the LED stack includes a plurality of first regions of the active layer.

5. A method according to claim 2, wherein the plurality of second regions of the LED stack includes a plurality of second regions of the first semiconducting layer; and the plurality of first regions of the LED stack includes a plurality of first regions of the first semiconducting layer.

6. A method according to claim 1, wherein the second portion of the LED stack surface encircles the first portion of the LED stack surface.

7. A method according to claim 1, wherein the plurality of second portions of the LED stack surface are arranged in an annular or chequerboard pattern.

8. A method according to claim 1, wherein the poisoning process comprises exposing the second portion of the LED stack surface to a plasma comprising hydrogen ions.

9. A method according to claim 1, wherein the LED stack formed comprises a column having a regular trapezoidal cross-section in a plane normal to the LED stack surface.

10. A method according to claim 9, wherein forming the LED stack comprises:

forming a first semiconducting layer comprising a Group III-nitride on a substrate surface of the substrate, the first semiconducting layer having a growth surface on an opposite side of the first semiconducting layer to the substrate;

selectively removing a portion of the first semiconducting layer to form a mesa structure such that the growth surface of the first semiconducting layer comprises a mesa surface and a bulk semiconducting surface;

monolithically forming a second semiconducting layer comprising a Group III-nitride on the growth surface of the first semiconducting layer such that the second semiconducting layer covers the mesa surface and the bulk semiconducting surface;

forming an active layer comprising a Group III-nitride on the first semiconducting layer; and forming a p-type semiconducting layer comprising a Group III-nitride on the active layer, wherein a major surface of the p-type semiconducting layer on an opposite side of the p-type semiconducting layer to the active layer provides an LED stack surface of the LED stack, and wherein the active layer and the p-type semiconducting layer are formed on the second semiconducting layer.

11. A method according to claim 10, wherein the plurality of second regions of the LED stack includes plurality of a second regions of the second semiconducting layer; and the plurality of first regions of the LED stack includes a plurality of first regions of the second semiconducting layer.

12. A method according to claim 11, wherein the second semiconducting layer is formed on the growth surface of the first semiconducting layer to provide an inclined sidewall portion extending between a first portion of the second semiconducting layer on the mesa surface of the first semiconducting layer and a second portion of the second semiconducting layer on the bulk semiconducting surface of the first semiconducting layer.

13. A method according to 11, wherein forming the first semiconducting layer on the substrate comprises:

forming a first semiconducting sublayer comprising a Group III-nitride on the substrate surface;

forming a dielectric sublayer on the first semiconducting sublayer, the dielectric sublayer defining an aperture through a thickness of the dielectric sublayer; and forming a second semiconducting sublayer comprising a Group III-nitride on the dielectric sublayer, and wherein selectively removing a portion of the first semiconducting layer to form a mesa structure comprises selectively removing a portion of the second semiconducting sublayer to form a mesa structure which is aligned with the aperture of the dielectric sublayer.

14. A method according to claim 2, wherein the active layer of the LED stack comprises a plurality of quantum well layers configured to output visible light.

15. A method according to claim 1, wherein the LED precursor is a micro LED precursor wherein the LED stack has a surface area on the substrate of no greater than 100 μm×100 μm, or no greater than 10 μm×10 μm.

\*    \*    \*    \*    \*